US012641971B2

(12) United States Patent
Du et al.

(10) Patent No.: US 12,641,971 B2
(45) Date of Patent: May 26, 2026

(54) DISPLAY SUBSTRATE AND DISPLAY APPARATUS WITH PIXEL CIRCUIT OF FIRST SUB-DISPLAY REGION CONNECTED TO LIGHT-EMITTING ELEMENT OF SECOND SUB-DISPLAY REGION

(71) Applicants:Chengdu BOE Optoelectronics Technology Co., Ltd., Chengdu (CN); BOE Technology Group Co., Ltd., Beijing (CN)

(72) Inventors: Lili Du, Beijing (CN); Xilei Cao, Beijing (CN); Zhenhua Zhang, Beijing (CN); Benlian Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 496 days.

(21) Appl. No.: 18/033,364

(22) PCT Filed: Mar. 18, 2022

(86) PCT No.: PCT/CN2022/081777
§ 371 (c)(1),
(2) Date: Apr. 24, 2023

(87) PCT Pub. No.: WO2023/173424
PCT Pub. Date: Sep. 21, 2023

(65) Prior Publication Data
US 2024/0381712 A1 Nov. 14, 2024

(51) Int. Cl.
*H10K 59/131* (2023.01)

(52) U.S. Cl.
CPC ................................. *H10K 59/131* (2023.02)

(58) Field of Classification Search
CPC .................................................... H10K 59/131
See application file for complete search history.

(56) References Cited

U.S. PATENT DOCUMENTS

2018/0219058 A1* 8/2018 Xiang ..................... H10K 59/60
2020/0052048 A1* 2/2020 Kuo ........................ G06F 1/1605
(Continued)

FOREIGN PATENT DOCUMENTS

CN 108389879 A 8/2018
CN 111261684 A 6/2020
(Continued)

OTHER PUBLICATIONS

International Search Report for PCT/CN2022/081777 Mailed Nov. 17, 2022.

*Primary Examiner* — Lex H Malsawma
(74) *Attorney, Agent, or Firm* — Ling Wu; Stephen Yang; Ling and Yang Intellectual Property

(57) ABSTRACT

Disclosed is a display substrate including a base substrate, a plurality of first light emitting elements, a plurality of first pixel circuits, and a plurality of second pixel circuits located in a first display region, and a plurality of second light emitting elements located in a second display region. The first display region includes a first first sub-display region to an N-th first sub-display region arranged sequentially along a side away from the second display region in a first direction, wherein N is an integer greater than 1. The second display region includes at least one second sub-display region. A second light emitting element of the second sub-display region is electrically connected with a second pixel circuit of an n-th first sub-display region, and a first light emitting element of the n-th first sub-display region is electrically connected with a first pixel circuit of an (n+i)-th first sub-display region.

19 Claims, 23 Drawing Sheets

(56) References Cited

U.S. PATENT DOCUMENTS

| | | | |
|---|---|---|---|
| 2021/0012706 A1* | 1/2021 | Yang | G09G 3/32 |
| 2022/0069047 A1 | 3/2022 | Yang et al. | |
| 2022/0102421 A1 | 3/2022 | Yang et al. | |
| 2022/0102472 A1 | 3/2022 | Huang et al. | |
| 2022/0199734 A1 | 6/2022 | Ko et al. | |
| 2022/0343862 A1* | 10/2022 | Cheng | H10K 59/131 |
| 2023/0132313 A1 | 4/2023 | Yang et al. | |

FOREIGN PATENT DOCUMENTS

| | | | |
|---|---|---|---|
| CN | 111785761 A | 10/2020 | |
| CN | 111834399 A | 10/2020 | |
| CN | 111916486 A | 11/2020 | |
| CN | 112038381 A | 12/2020 | |
| CN | 112151592 A | 12/2020 | |
| CN | 112151694 A | 12/2020 | |
| CN | 112216733 A | 1/2021 | |
| CN | 112909056 A | 6/2021 | |
| CN | 113270036 A | 8/2021 | |
| CN | 113517324 A | 10/2021 | |
| CN | 113823644 A | 12/2021 | |
| WO | 2021237540 A1 | 12/2021 | |

* cited by examiner

DISPLAY SUBSTRATE AND DISPLAY APPARATUS WITH PIXEL CIRCUIT OF FIRST SUB-DISPLAY REGION CONNECTED TO LIGHT-EMITTING ELEMENT OF SECOND SUB-DISPLAY REGION

CROSS-REFERENCE TO RELATED APPLICATION

The present application is a U.S. National Phase Entry of International Application No. PCT/CN2022/081777 having an international filing date of Mar. 18, 2022. The entire contents of the above-identified application are hereby incorporated by reference.

TECHNICAL FIELD

The present disclosure relates to, but is not limited to, the field of display technologies, in particular to a display substrate and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. An Under Display Camera technology is a brand-new technology proposed to improve a screen-to-body ratio of a display apparatus.

SUMMARY

The following is a summary of subject matters described herein in detail. The summary is not intended to limit the protection scope of claims.

Embodiments of the present disclosure provide a display substrate and a display apparatus.

In one aspect, an embodiment of the present disclosure provides a display substrate including a base substrate, a plurality of pixel circuits, and a plurality of light emitting elements. The base substrate includes a first display region and a second display region, and the first display region is located on at least one side of the second display region. The plurality of pixel circuits include a plurality of first pixel circuits and a plurality of second pixel circuits located in the first display region, and the plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting elements, and the at least one first pixel circuit is configured to drive the at least one first light emitting element to emit light. At least one second pixel circuit in the plurality of second pixel circuits is electrically connected with at least one second light emitting element in the plurality of second light emitting elements, and the at least one second pixel circuit is configured to drive the at least one second light emitting element to emit light. The first display region includes a first first sub-display region to an N-th sub-display region arranged sequentially along a side away from the second display region in a first direction, wherein N is an integer greater than 1. The second display region includes at least one second sub-display region, a second light emitting element of the second sub-display region is electrically connected with a second pixel circuit of an n-th first sub-display region, and a first light emitting element of the n-th first sub-display region is electrically connected with a first pixel circuit of an (n+i)-th first sub-display region, wherein both n and i are integers greater than 0 and less than N.

In some exemplary implementation modes, a first light emitting element of the (n+i)-th first sub-display region is electrically connected with a first pixel circuit of an (n+i+j)-th first sub-display region, wherein j is an integer greater than 0 and less than N.

In some exemplary implementation modes, j is equal to i.

In some exemplary implementation modes, the at least one first pixel circuit is electrically connected with the at least one first light emitting element through a first conductive line, and the at least one second pixel circuit is electrically connected with the at least one second light emitting element through a second conductive line.

In some exemplary implementation modes, a first conductive line or a second conductive line which is electrically connected with at least one pixel circuit within the at least one first sub-display region is of a different-layer structure with a first conductive line which is electrically connected with at least one first light emitting element.

In some exemplary implementation modes, a second conductive line electrically connecting the second pixel circuit of the n-th first sub-display region and the second light emitting element of the second sub-display region is of a different-layer structure with a first conductive line electrically connecting the first light emitting element of the n-th first sub-display region and the first pixel circuit of the (n+i)-th first sub-display region.

In some exemplary implementation modes, a first conductive line electrically connecting the first light emitting element of the (n+i)-th first sub-display region and the first pixel circuit of the (n+i+j)-th first sub-display region is of a different-layer structure with a first conductive line electrically connecting the first pixel circuit of the (n+i)-th first sub-display region and the first light emitting element of the n-th first sub-display region.

In some exemplary implementation modes, a quantity of pixel circuits within the at least one first sub-display region is greater than a quantity of first light emitting elements.

In some exemplary implementation modes, pixel circuits within the n-th first sub-display region are all second pixel circuits.

In some exemplary implementation modes, a quantity of pixel circuits of the n-th first sub-display region is greater than or equal to a quantity of pixel circuits of an (n+1)-th first sub-display region, and a quantity of first light emitting elements of the n-th first sub-display region is greater than or equal to a quantity of first light emitting elements of the (n+1)-th first sub-display region.

In some exemplary implementation modes, a second light emitting element within the second sub-display region close to the n-th first display region is electrically connected with a second pixel circuit within the n-th first sub-display region close to the second sub-display region, and a second light emitting element within the second sub-display region away from the n-th first sub-display region is electrically connected with a second pixel circuit within the n-th first sub-display region away from the second sub-display region.

In some exemplary implementation modes, pixel circuits of the first display region are arranged in an array, and the first direction is a row direction of the pixel circuits.

In some exemplary implementation modes, the second display region includes an M-th second sub-display region to a first second sub-display region which are arranged sequentially along a side away from the first sub-display region in the first direction, wherein M is an integer greater than 1 and less than N. Among them, a first sub-display region, in which a second pixel circuit electrically connected with a second light emitting element within an m-th second sub-display region is located, is located on a side of a first sub-display region, in which a second pixel circuit electrically connected with a second light emitting element within an (m+1)-th second sub-display region is located, close to the second display region, wherein m is an integer greater than 0 and less than M.

In some exemplary implementation modes, second conductive lines electrically connected with second light emitting elements within adjacent second sub-display regions are located in different conductive layers, and first conductive lines electrically connected with first light emitting elements within adjacent first sub-display regions are located in different conductive layers.

In some exemplary implementation modes, second conductive lines electrically connected with the plurality of second light emitting elements within the second sub-display region are of a same-layer structure.

In some exemplary implementation modes, second conductive lines electrically connected with adjacent second light emitting elements in the first direction within the second sub-display region are of a different-layer structure.

In some exemplary implementation modes, the first conductive line and the second conductive line are transparent conductive lines.

In some exemplary implementation modes, the first display region further includes a first third sub-display region to an H-th third sub-display region which are arranged sequentially along a side away from the second display region in a second direction, wherein H is an integer greater than 1. The second display region further includes at least one fourth sub-display region, a second light emitting element of the fourth sub-display region is electrically connected with a second pixel circuit of an h-th third sub-display region, and a first light emitting element of the h-th third sub-display region is electrically connected with a first pixel circuit of an (h+s)-th third sub-display region, wherein both h and s are integers greater than 0 and less than H.

In some exemplary implementation modes, the second direction is parallel to the first direction, or the second direction intersects with the first direction.

In some exemplary implementation modes, the first display region further includes a first fifth sub-display region to an R-th fifth sub-display region which are arranged sequentially along a side away from the second display region in a third direction, wherein R is an integer greater than 1. The second display region further includes at least one sixth sub-display region, a second light emitting element of the sixth sub-display region is electrically connected with a second pixel circuit of an r-th fifth sub-display region, and a first light emitting element of the r-th fifth sub-display region is electrically connected with a first pixel circuit of an (r+k)-th fifth sub-display region, wherein both r and k are integers greater than 0 and less than R.

In some exemplary implementation modes, the first display region further includes a first seventh sub-display region to a G-th seventh sub-display region which are arranged sequentially along a side away from the second display region in a fourth direction, wherein G is an integer greater than 1. The second display region further includes at least one eighth sub-display region, a second light emitting element of the eighth sub-display region is electrically connected with a second pixel circuit of a g-th seventh sub-display region, and a first light emitting element of the g-th seventh sub-display region is electrically connected with a first pixel circuit of a (g+d)-th seventh sub-display region, wherein both g and d are integers greater than 0 and less than G.

In some exemplary implementation modes, a density of the second light emitting elements is less or equal to a density of the first light emitting elements.

In some exemplary implementation modes, a resolution of the first display region is less than or equal to a resolution of the second display region.

In another aspect, an embodiment of the present disclosure provides a display apparatus, which includes the aforementioned display substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figures 1, 2:
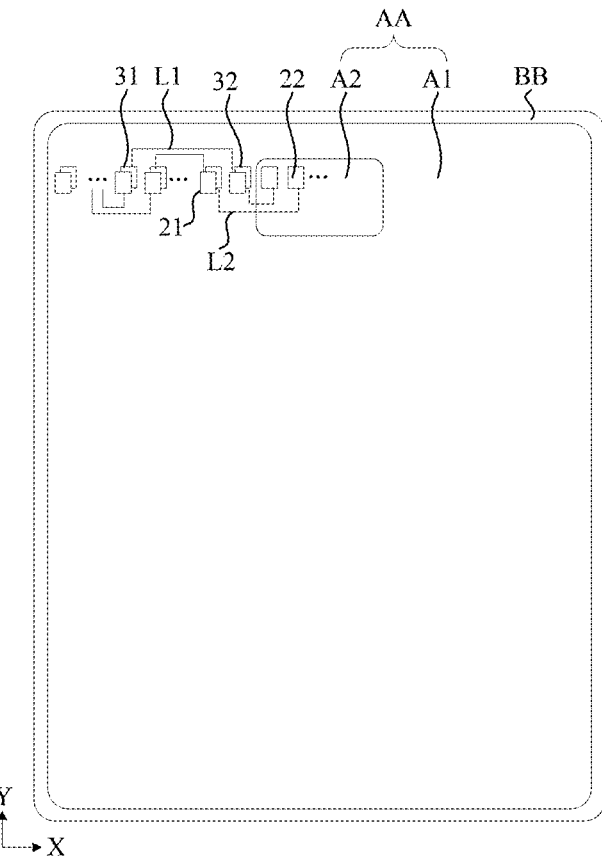
FIG. 1 is a schematic diagram of a display substrate according to at least one embodiment of the present disclosure.
FIG. 2 is an equivalent circuit diagram of a pixel circuit according to at least one embodiment of the present disclosure.

The embodiments of the present disclosure will be described below in combination with the drawings in detail. Implementation modes may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity. In the present disclosure, "plurality" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but further include a switching element such as a transistor, a resistor, an inductor, a capacitor, another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current is changed during work of a circuit, or the like, functions of the "source electrode" and the "drain electrode" may sometimes be exchangeable. Therefore, the "source electrode" and the "drain electrode" may be exchangeable in the specification. In addition, the gate electrode may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 800 and below 100°, and thus also includes a state in which the angle is above 850 and below 95°.

A "light transmission rate" in the present disclosure refers to an ability of light to pass through a medium, and is a percentage of luminous flux passing through a transparent or translucent body to its incident luminous flux.

In the present disclosure, "about" and "substantially" refer to that a boundary is not defined strictly and a situation within a process and measurement error range is allowed. In the present disclosure, "substantially the same" refers to a case where numerical values differ by less than 10%.

An embodiment of the present disclosure provides a display substrate including a base substrate, a plurality of pixel circuits, and a plurality of light emitting elements. The base substrate includes a first display region and a second display region, and the first display region is located on at least one side of the second display region. The plurality of pixel circuits include a plurality of first pixel circuits and a plurality of second pixel circuits located in the first display region. The plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting element, and the at least one first pixel circuit is configured to drive the at least one first light emitting element to emit light. At least one second pixel circuit in the plurality of second pixel circuits is electrically connected with at least one second light emitting element in the plurality of second light emitting elements, and the at least one second pixel circuit is configured to drive the at least one second light emitting element to emit light. The first display region includes a first first sub-display region to an N-th first sub-display region arranged sequentially along a side away from the second display region in a first direction, wherein N is an integer greater than 1. The second display region includes at least one second sub-display region, a second light emitting element of the second sub-display region is electrically connected with a second pixel circuit of an n-th first sub-display region, and a first light emitting element of the n-th first sub-display region is electrically connected with a first pixel circuit of an (n+i)-th first sub-display region, wherein both n and i are integers greater than 0 and less than N. For example, i may be 1 or 2 and so on. In this example, the n-th first sub-display region is located on a side of the (n+1)-th first sub-display region close to the second display region.

In some examples, the second display region may only include one second sub-display region. Or, the second display region may include a plurality of second sub-display regions. For example, a plurality of second sub-display regions may be arranged sequentially in the first direction along a side away from a first sub-display region. However, this embodiment is not limited thereto.

According to the display substrate provided by this embodiment, the first display region and the second display region are partitioned, a second light emitting element of a second sub-display region of the second display region is electrically connected with a second pixel circuit of one first sub-display region of the first display region, and a first light emitting element of the first sub-display region is electrically connected with a first pixel circuit in another first sub-display region, thereby achieving a dislocation connection between a pixel circuit and a light emitting element within different partitions. According to this embodiment, a length difference of conductive lines electrically connecting second light emitting elements and second pixel circuits may be reduced. A length of a conductive line will determine a size of an overlapping area between the conductive line and another signal trace, which thus affects a size of a parasitic capacitance, while a large difference of parasitic capacitances will lead to uneven picture display. According to this embodiment, a length difference of conductive lines is reduced through a dislocation connection of a pixel circuit and a light emitting element within different partitions, thereby improving poor uniformity of a display picture, improving display uniformity, and achieving a more uniform full-screen visual display effect.

In some exemplary implementation modes, at least one first pixel circuit may be electrically connected with at least one first light emitting element through a first conductive line, and at least one second pixel circuit may be electrically connected with at least one second light emitting element through a second conductive line. For example, the first conductive line and the second conductive line may both be transparent conductive lines. The first conductive line and the second conductive line may be made of a transparent conductive material (such as Indium Tin Oxide (ITO). However, this embodiment is not limited thereto. In other examples, the first conductive line may be a non-transparent conductive line, and the second conductive line may be a transparent conductive line. For example, the first conductive line may be made of a metal material, and the second conductive line may be made of a transparent conductive material (e.g., ITO).

In some exemplary implementation modes, a first light emitting element of an (n+i)-th first sub-display region may be electrically connected with a first pixel circuit of an (n+i+j)-th first sub-display region, wherein j is an integer greater than 0 and less than N. In this example, a dislocation connection between a first light emitting element of a first sub-display region of the first display region and a first pixel circuit of another first sub-display region may be made to support disposing a second pixel circuit near or around the second display region, thereby improving a case where a length difference of second conductive lines electrically connecting second pixel circuits and second light emitting elements is too large.

In some examples, j may be equal to i. For example, i and j may both be 1 or 2. For example, a first light emitting element of an (n+i)-th first sub-display region may be electrically connected with a first pixel circuit of an (n+2×i)-th first sub-display region, and a first light emitting element of the (n+2×i)-th first sub-display region may be electrically connected with a first pixel circuit of an (n+3×i)-th first sub-display region. However, this embodiment is not limited thereto. For example, j may be different from i. For example, i may be 2, and j may be 1.

In some exemplary implementation modes, a first conductive line or a second conductive line which is electrically connected with at least one pixel circuit within at least one first sub-display region may be of a different-layer structure with a first conductive line which is electrically connected with at least first light emitting element. In the present disclosure, A and B being of a different-layer structure represents that A and B are located in different conductive layers. In this way, mutual interference between different conductive lines may be avoided. In some examples, a second conductive line electrically connecting a second light emitting element of a second sub-display region and a second pixel circuit of an n-th first sub-display region may be of a different-layer structure with a first conductive line electrically connecting a first light emitting element of the n-th first sub-display region and a first pixel circuit of an (n+i)-th first sub-display region. In some examples, a first conductive line electrically connecting a first light emitting element of an (n+i)-th first sub-display region and a first pixel circuit of an (n+i+j)-th first sub-display region may be of a different-layer structure with a first conductive line electrically connecting a light emitting element of an n-th first sub-display region and a first pixel circuit of the (n+i)-th first sub-display region.

In some exemplary implementation modes, pixel circuits of the n-th first sub-display region may all be second pixel circuits. In this example, by centrally disposing second pixel circuits near the second display region, it may be beneficial to reduce a length of a second conductive line electrically connecting a second light emitting element and a second pixel circuit.

In some exemplary implementation modes, a quantity of pixel circuits within at least one first sub-display region may be greater than a quantity of first light emitting elements. In some examples, space in which a second pixel circuit is disposed is formed by compressing pixel circuits within the first display region, thus a quantity of the pixel circuits in the first display region is greater than a quantity of first light emitting elements.

In some exemplary implementation modes, a quantity of pixel circuits of an n-th first sub-display region may be greater than or equal to a quantity of pixel circuits of an (n+1)-th first sub-display region, and a quantity of first light emitting elements of the n-th first sub-display region may be greater than or equal to a quantity of first light emitting elements of the (n+1)-th first sub-display region. In some examples, along a side away from the second display region in the first direction, a quantity of pixel circuits within a plurality of first sub-display regions may be gradually reduced, and a quantity of first light emitting elements may also be gradually reduced.

In some exemplary implementation modes, a second light emitting element within a second sub-display region close to an n-th first display region may be electrically connected with a second pixel circuit within an n-th first sub-display region close to the second sub-display region, and a second light emitting element within the second sub-display region away from the n-th first sub-display region may be electrically connected with a second pixel circuit within the n-th first sub-display region away from the second sub-display region. A connection mode of a second light emitting element and a second pixel circuit within a corresponding region provided by this example is helpful to arrange conductive lines and reduce a case of mutual interference caused by overlapping of the conductive lines. However, this embodiment is not limited thereto.

In some exemplary implementation modes, the plurality of pixel circuits of the first display region may be arranged in an array, and the first direction may be a row direction of the pixel circuits. However, this embodiment is not limited thereto. For example, the first direction may be a column direction of the pixel circuits, or may be a direction that intersects with the row direction, or may be a direction that intersects with the column direction.

In some exemplary implementation modes, the second display region may include an M-th second sub-display region to a first second sub-display region which are arranged sequentially along a side away from a first sub-display region in the first direction. Among them, M is an integer greater than 1 and less than N. A first sub-display region, in which a second pixel circuit electrically connected with a second light emitting element within an m-th second sub-display region is located, may be located on a side of a first sub-display region, in which a second pixel circuit electrically connected with a second light emitting element within an (m+1)-th second sub-display region is located, close to the second display region, wherein m is an integer greater than 0 and less than M. In this example, a second light emitting element within a second sub-display region away from the first display region may be electrically connected with a second pixel circuit within a first sub-display region close to the second display region, a second light emitting element within a second sub-display region close to the first display region may be electrically connected with a second pixel circuit within a first sub-display region away from the second display region. In this way, it may be helpful to reduce a length difference between second conductive lines electrically connecting second light emitting elements and second pixel circuits. In some examples, the entire second display region may be divided into a plurality of second sub-display regions or a portion of the second display region may be divided into a plurality of second sub-display regions. However, this embodiment is not limited thereto.

In some exemplary implementation modes, second conductive lines electrically connected with second light emitting elements within adjacent second sub-display regions may be located in different conductive layers, and first conductive lines electrically connected first light emitting elements within adjacent first sub-display regions may be located in different conductive layers. In this way, a case of mutual interference due to overlapping of conductive lines may be reduced.

In some exemplary implementation modes, second conductive lines electrically connected with a plurality of second light emitting elements within a second sub-display region may be of a same-layer structure. Or, second conductive lines electrically connected with adjacent second light emitting elements in the first direction with a second sub-display region may be of a different-layer structure. However, this embodiment is not limited thereto. In other examples, a second conductive line which is electrically connected with a second light emitting element may be formed by connecting a plurality of conductive line segments, and adjacent conductive line segments may be located in different conductive layers.

In some exemplary implementation modes, the first display region may further include a first third sub-display region to a H-th third sub-display region which are arranged sequentially in a second direction along a side away from the second display region, wherein H is an integer greater than 1. The second display region may further include at least one fourth sub-display region, a second light emitting element of the fourth sub-display region is electrically connected with a second pixel circuit of a h-th third sub-display region, and a first light emitting element of the h-th third sub-display region is electrically connected with a first pixel circuit of a (h+s)-th third sub-display region, wherein both h and s are integers greater than 0 and less than H. For example, h and s may both be 1, or, h may be 1 and s may be 2. In some examples, the second direction may be parallel to the first direction, or the second direction may intersect with the first direction. According to the example, by dividing the first display region and the second display region into a plurality of partitions in the first direction and the second direction and performing a dislocation connection of a light emitting element and a pixel circuit in the plurality of partitions, it is beneficial to reduce a length difference of conductive lines electrically connecting second light emitting elements and second pixel circuits.

In some exemplary implementation modes, the first display region may further include a first fifth sub-display region to an R-th fifth sub-display region which are arranged sequentially in a third direction along a side away from the second display region, wherein R is an integer greater than 1. The second display region may further include at least one sixth sub-display region. A second light emitting element of the sixth sub-display region is electrically connected with a second pixel circuit of an r-th fifth sub-display region, and a first light emitting element of the r-th fifth sub-display region is electrically connected with a first pixel circuit of an (r+k)-th fifth sub-display region, wherein both r and k are integers greater than 0 and less than R. For example, r and k may both be 1, or, r may be 1 and k may be 2. In some examples, the third direction may be parallel to the first direction or the second direction, or the third direction may intersect with the first direction, or the third direction may intersect with the second direction. According to the example, by dividing the first display region and the second display region into a plurality of partitions in a plurality of directions and performing a dislocation connection of a light emitting element and a pixel circuit in the plurality of partitions, it is beneficial to reduce a length difference of conductive lines electrically connecting second light emitting elements and second pixel circuits.

In some exemplary implementation modes, the first display region may further include a first seventh sub-display region to a G-th seventh sub-display region which are arranged sequentially in a fourth direction along a side away from the second display region, wherein G is an integer greater than 1. The second display region may further include at least one eighth sub-display region. A second light emitting element of the eighth sub-display region is electrically connected with a second pixel circuit of a g-th seventh sub-display region, and a first light emitting element of the g-th seventh sub-display region is electrically connected with a first pixel circuit of a (g+d)-th seventh sub-display region. Among them, g and d are both integers greater than 0 and less than G. For example, g and d may both be 1, or, g may be 1 and d may be 2. In some examples, the fourth direction may be parallel to the first direction, the second direction, or the third direction; or, the fourth direction may intersect with the first direction, the second direction, or the third direction. According to the example, by dividing the first display region and the second display region into a plurality of partitions in a plurality of directions and performing a dislocation connection of a light emitting element and a pixel circuit in the plurality of partitions, it is beneficial to reduce a length difference of conductive lines electrically connecting second light emitting elements and second pixel circuits.

In some examples, N, H, R, and G may be the same; or, at least two of N, H, R, and G may be the same; or, N, H, R, and G may be different from each other. However, this embodiment is not limited thereto.

In some examples, i, s, k, and d may be the same, or at least two of i, s, k, and d may be the same, or i, s, k, and d may be different from each other. However, this embodiment is not limited thereto.

Solutions of the embodiments will be described below through some examples.

FIG. 1 is a schematic diagram of a display substrate according to at least one embodiment of the present disclosure. In some exemplary implementation modes, as shown in FIG. 1, the display substrate may include a display region AA and a peripheral region BB surrounding a periphery of the display region AA. The display region AA of the display substrate may include a first display region A1 and a second display region A2, and the first display region A1 is located on at least one side of the second display region A2. For example, the first display region A1 may surround the second display region A2. However, this embodiment is not limited thereto. For example, the first display region A1 may partially surround the second display region A2.

In some exemplary implementation modes, as shown in FIG. 1, the second display region A2 is a light-transmitting display region and may also be referred to as an Under Display Camera (UDC) region; the first display region A1 is a non-light-transmitting display region and may also be referred to as a normal display region. For example, an orthographic projection of a photosensitive sensor (such as a camera and other hardware) on the display substrate may be located in the second display region A2 of the display substrate. In some examples, as shown in FIG. 1, the second display region A2 may be circular and a size of the orthographic projection of the photosensitive sensor on the display substrate may be less than or equal to a size of the second display region A2. However, this embodiment is not limited thereto. In other examples, the second display region A2 may be rectangular, and a size of the orthographic projection of the photosensitive sensor on the display substrate may be less than or equal to a size of an inscribed circle of the second display region A2.

In some exemplary implementation modes, as shown in FIG. 1, the second display region A2 may be located at a top middle position of the display region AA. The first display region A1 may surround the second display region A2. However, this embodiment is not limited thereto. For example, the second display region A2 may be located in another position such as an upper left corner or an upper right corner of the display region AA. For example, the first display region A1 may surround at least one side of the second display region A2.

In some exemplary implementation modes, as shown in FIG. 1, the display region AA may have a shape of a rectangle, e.g., a rounded rectangle. The second display region A2 may be circular or elliptical. However, this embodiment is not limited thereto. For example, the second display region A2 may be rectangular, semi-circular, pentagonal, or have another shape.

In some exemplary implementation modes, the display region AA may be provided with a plurality of sub-pixels. At least one sub-pixel may include a pixel circuit and a light emitting element. The pixel circuit may be configured to drive a connected light emitting element. For example, the pixel circuit may be configured to provide a drive current to drive the light emitting element to emit light. The pixel circuit may include a plurality transistors and at least one capacitor, and for example, the pixel circuit may be of a 3T1C (i.e., three transistors and one capacitor) structure, a 7T1C (i.e., seven transistors and one capacitor) structure, a 5T1C (i.e., five transistors and one capacitor) structure, an 8T1C (i.e., eight transistors and one capacitor) structure, or an 8T2C (i.e., eight transistors and two capacitors) structure, etc. In some examples, the light emitting element may be an Organic Light Emitting Diode (OLED), and the light emitting element emits red light, green light, blue light, or white light, etc. when driven by a pixel circuit corresponding to the light emitting element. A color of light emitted by the light emitting element may be determined as required. In some examples, the light emitting element may include an anode, a cathode, and an organic emitting layer disposed between the anode and the cathode. The anode of the light emitting element may be electrically connected with a corresponding pixel circuit. However, this embodiment is not limited thereto.

In some exemplary implementation modes, a pixel unit in the display region AA may include three sub-pixels, and the three sub-pixels may be a red sub-pixel, a green sub-pixel, and a blue sub-pixel respectively. However, this embodiment is not limited thereto. In some examples, one pixel unit may include four sub-pixels, and the four sub-pixels may be a red sub-pixel, a green sub-pixel, a blue sub-pixel, and a white sub-pixel respectively.

In some exemplary implementation modes, a shape of the light emitting element may be a rectangle, a rhombus, a pentagon, or a hexagon. When a pixel unit includes three sub-pixels, light emitting elements of the three sub-pixels may be arranged side by side horizontally, side by side vertically, or in a manner like a Chinese character "i t". When a pixel unit includes four sub-pixels, light emitting elements of the four sub-pixels may be arranged side by side horizontally, side by side vertically, or in a manner to form a square. However, this embodiment is not limited thereto.

Figure 3:
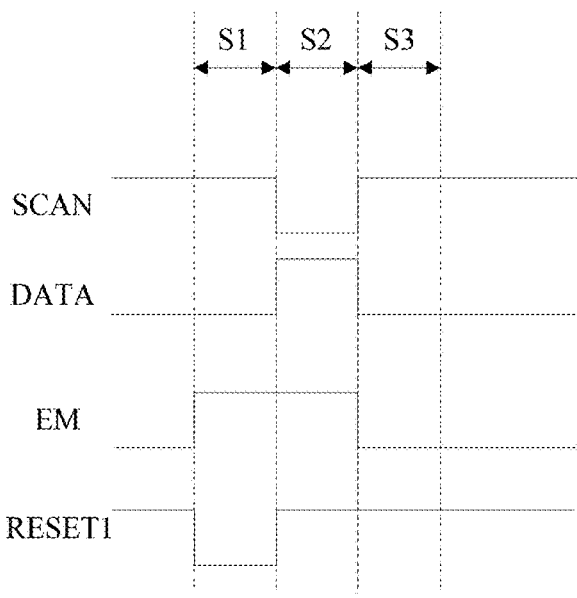
FIG. 3 is a working timing diagram of the pixel circuit provided in FIG. 2.

FIG. 2 is an equivalent circuit diagram of a pixel circuit according to at least one embodiment of the present disclosure. FIG. 3 is a working timing diagram of the pixel circuit provided in FIG. 2. The pixel circuit of the exemplary embodiment is described by taking a 7T1C structure as an example. However, this embodiment is not limited thereto.

In some exemplary implementation modes, as shown in FIG. 2, the pixel circuit of this example may include six switching transistors (T1, T2, and T4 to T7), a drive transistor T3, and a storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. The light emitting element EL may include an anode, a cathode, and an organic emitting layer disposed between the anode and the cathode.

In some exemplary implementation modes, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary implementation modes, the drive transistor and the six switching transistors may include a P-type transistor and an N-type transistor.

In some exemplary implementation modes, Low Temperature Poly Silicon thin film transistors, or oxide thin film transistors, or a Low Temperature Poly Silicon thin film transistor and an oxide thin film transistor may be adopted for the drive transistor and the six switching transistors. An active layer of a Low Temperature Poly Silicon thin film transistor is made of Low Temperature Poly Silicon (LTPS), and an active layer of an oxide thin film transistor is made of an oxide semiconductor (Oxide). A Low Temperature Poly Silicon thin film transistor has advantages such as a high mobility and fast charging, and an oxide thin film transistor has advantages such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low frequency drive, reduce power consumption, and improve display quality.

In some exemplary implementation modes, as shown in FIG. 2, a display substrate may include a scan line GL, a data line DL, a first power supply line PL1, a second power supply line PL2, a light emitting control line EML, a first initial signal line INIT1, a second initial signal line INTT2, a first reset control line RST1, and a second reset control line RST2. In some examples, the first power supply line PL1 may be configured to provide a constant first voltage signal VDD to a pixel circuit, the second power supply line PL2 may be configured to provide a constant second voltage signal VSS to the pixel circuit, and the first voltage signal VDD is greater than the second voltage signal VSS. The scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the first reset control line RST1 may be configured to provide a first reset control signal RESET1 to the pixel circuit, and the second reset control line RST2 may be configured to provide a second reset control signal RESET2 to the pixel circuit. In some examples, in a pixel circuit of a z-th row, a first reset control line RST1 may be electrically connected with a scan line GL of a pixel circuit of a (z−1)-th row to be inputted with a scan signal SCAN(z−1), that is, a first reset control signal RESET1(z) is the same as the scan signal SCAN(z−1). A second reset control line RST2 may be electrically connected with a scan line GL of the pixel circuit of the z-th row to be inputted with a scan signal SCAN(z), that is, a second reset control signal RESET2(z) is the same as the scan signal SCAN(z). In some examples, a second reset control line RST2 with which the pixel circuit of the z-th row is electrically connected and a first reset control line RST1 with which the pixel circuit of the (z+1)-th row is electrically connected may be of an integral structure. Among them, z is an integer greater than 0. In this way, signal lines of the display substrate may be reduced, and a design of a narrow bezel of the display substrate may be achieved. However, this embodiment is not limited thereto.

In some exemplary implementation modes, the first initial signal line INTT1 may be configured to provide a first initial signal to the pixel circuit, the second initial signal line INIT2 may be configured to provide a second initial signal to the pixel circuit. For example, the first initial signal may be different from the second initial signal. The first initial signal and the second initial signal may be constant voltage signals, and their magnitudes, for example, may be between the first voltage signal VDD and the second voltage signal VSS, but not limited thereto. In other examples, the first initial signal and the second initial signal may be the same, and only one first initial signal line may be disposed to provide the first initial signal.

In some exemplary implementation modes, as shown in FIG. 2, a drive transistor T3 is electrically connected with a light emitting element EL, and outputs a drive current to drive the light emitting element EL to emit light under control of a scan signal SCAN, a data signal DATA, a first voltage signal VDD, a second voltage signal VSS and etc. A gate of a data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of a threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of a first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the drive transistor T3. A gate of a second light emitting control transistor T6 is electrically connected with the light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. A first reset transistor T1 is electrically connected with the gate of the drive transistor T3 and configured to reset the gate of the drive transistor T3, and a second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INTT2, and a second electrode of the second reset transistor T7 is electrically connected with the anode of the light emitting element EL. A first capacitor electrode plate of a storage capacitor Cst is electrically connected with the gate of the drive transistor T3, and a second capacitor electrode plate of the storage capacitor Cst is electrically connected with the first power supply line PL1.

In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

A working process of the pixel circuit illustrated in FIG. 2 will be described below with reference to FIG. 3. Description is given by taking a case in which a plurality of transistors included in the pixel circuit shown in FIG. 2 are all P-type transistors as an example.

In some exemplary implementation modes, as shown in FIG. 3, during one-frame display time period, the working process of the pixel circuit may include a first stage S1, a second stage S2, and a third stage S3.

The first stage S1 is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage S2 is referred to as a data writing stage or a threshold compensation stage. A scan signal SCAN provided by the scan line GL is a low-level signal, a first reset control signal RESET1 provided by the first reset control line RST1 and a light emitting control signal EM provided by the light emitting control line EML are both high-level signals, and the data line DL outputs a data signal DATA. In this phase, the first capacitor electrode plate of the storage capacitor Cst is at a low level, thus the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the first capacitor electrode plate (that is, the first node N1) of the storage capacitor Cst is Vdata-|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, thus completing initialization and ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

The third stage S3 is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Since the voltage of the first node N1 is Vdata-|Vth|, the drive current of the drive transistor T3 is as follows.

$$I=K\times(Vgs-Vth)^2=K\times[(VDD-V\text{data}+|Vth|)-Vth]^2=K\times[VDD-V\text{data}]^2$$

Among them, I is the drive current flowing through the drive transistor T3, that is, a drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

Figure 4:
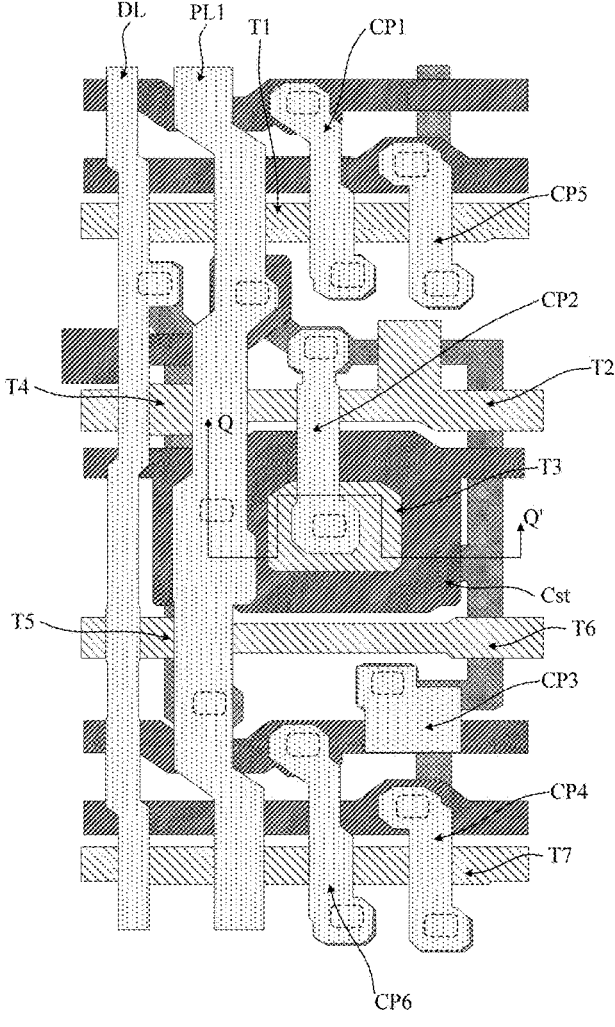
FIG. 4 is a schematic top view of a pixel circuit according to at least one embodiment of the present disclosure.
Figure 5:
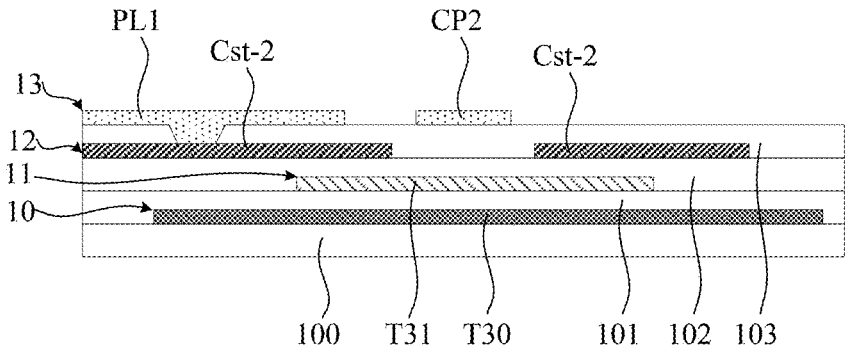
FIG. 5 is a partial cross-sectional schematic diagram along a Q-Q' direction in FIG. 4.
Figure 6A:
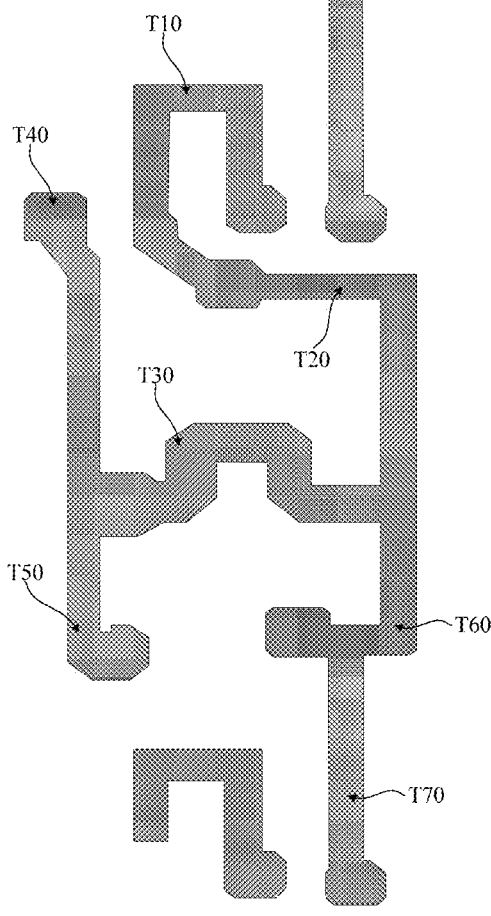
FIG. 6A is a top view of the pixel circuit after a semiconductor layer is formed in FIG. 4.
Figure 6B:
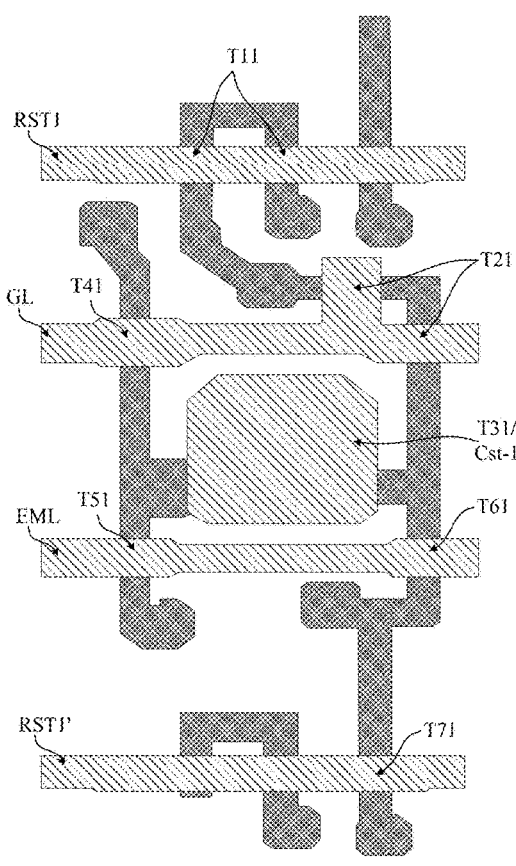
FIG. 6B is a top view of the pixel circuit after a first conductive layer is formed in FIG. 4.
Figure 6C:
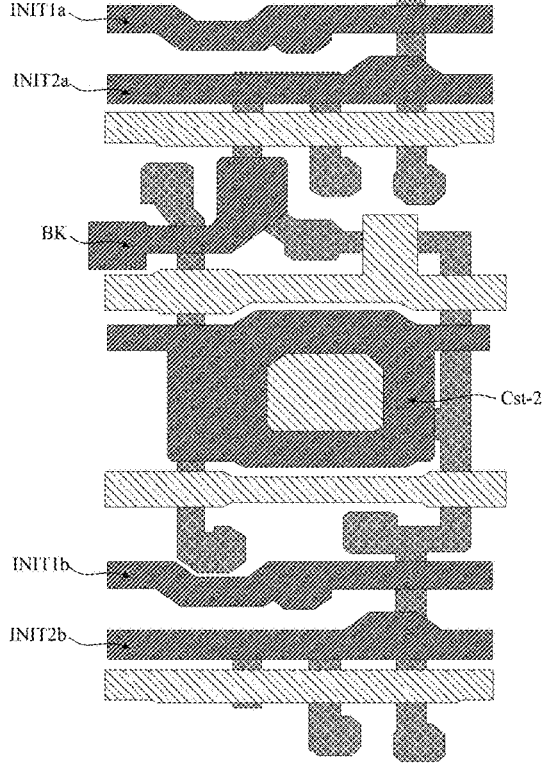
FIG. 6C is a top view of the pixel circuit after a second conductive layer is formed in FIG. 4.
Figure 6D:
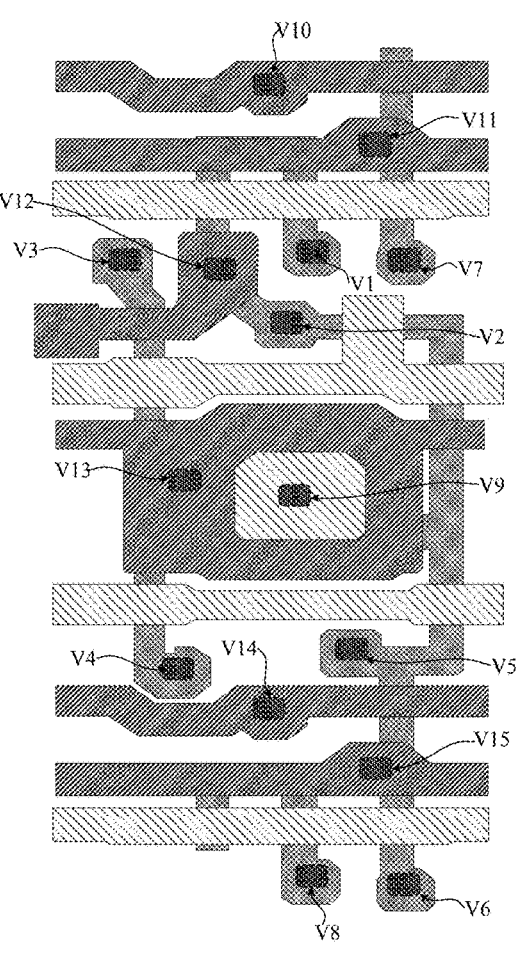
FIG. 6D is a top view of the pixel circuit after a third insulation layer is formed in FIG. 4.

FIG. 4 is a schematic top view of a pixel circuit according to at least one embodiment of the present disclosure. FIG. 5 is a partial cross-sectional schematic diagram along a Q-Q' direction in FIG. 4. FIG. 6A is a top view of the pixel circuit after a semiconductor layer is formed in FIG. 4. FIG. 6B is a top view of the pixel circuit after a first conductive layer is formed in FIG. 4. FIG. 6C is a top view of the pixel circuit after a second conductive layer is formed in FIG. 4. FIG. 6D is a top view of the pixel circuit after a third insulation layer is formed in FIG. 4.

In some exemplary embodiments, as shown in FIG. 4 to FIG. 6D, a display substrate may include a base substrate 100, and a semiconductor layer 10, a first conductive layer 11, a second conductive layer 12, and a third conductive layer 13 which are disposed sequentially on the base substrate 100. A first insulation layer 101 is disposed between the semiconductor layer 10 and the first conductive layer 11, a second insulation layer 102 is disposed between the first conductive layer 11 and the second conductive layer 12, and a third insulation layer 103 is disposed between the second conductive layer 12 and the third conductive layer 13. The first insulation layer 101, the second insulation layer 102, and the third insulation layer 103 may be inorganic insulation layers. The first insulation layer 101 and the second insulation layer 102 may also be referred to as gate insulation layers, and the third insulation layer 103 may also be referred to as an interlayer dielectric layer. In some examples, a fourth conductive layer may also be disposed on a side of the third conductive layer away from the base substrate 100, and the fourth conductive layer may include an anode connection electrode that may connect the pixel circuit and a light emitting element. At least one transparent conductive layer may also be disposed on a side of the fourth conductive layer away from the base substrate, and the transparent conductive layer may include a transparent conductive line configured to connect the anode connection electrode and an anode of the light emitting element. A planarization layer may be disposed between fourth conductive layer and the transparent conductive layer, and a planarization layer may be disposed between adjacent transparent conductive layers. An anode layer, a pixel definition layer, an organic emitting layer, and a cathode layer may be disposed sequentially on a side of the transparent conductive layer away from the base substrate. However, this embodiment is not limited thereto.

In some exemplary embodiments, as shown in FIG. 4 to FIG. 6A, the semiconductor layer 10 of the display substrate may include active layers of the plurality of transistors of the pixel circuits (for example, a first active layer T10 of a first reset transistor T1, a second active layer T20 of a threshold compensation transistor T2, a third active layer T30 of a drive transistor T3, a fourth active layer T40 of a data writing transistor T4, a fifth active layer T50 of a first light emitting control transistor T5, a sixth active layer T60 of a second light emitting control transistor T6, and a seventh active layer T70 of a second reset transistor T7). Active layers of a plurality of transistors of one pixel circuit may be of an integral structure. At least one active layer may include a channel region, a first doped region, and a second doped region, the channel region may not be doped with an impurity and has characteristics of a semiconductor, the first doped region and the second doped region may be on both sides of the channel region and are doped with impurity particles, and thus have conductivity. The impurity may be changed according to a type of a transistor. The first doped region or the second doped region of the semiconductor layer may be interpreted as a source electrode or drain electrode of a transistor.

In some exemplary embodiments, as shown in FIG. 4 to FIG. 6B, the first conductive layer 11 of the display substrate may include control electrodes of a plurality of transistors of the pixel circuit (e.g., a control electrode T11 of a first reset transistor T1, a control electrode T21 of a threshold compensation transistor T2, a control electrode T31 of a drive transistor T3, a control electrode T41 of a data writing transistor T4, a control electrode T51 of a first light emitting control transistor T5, a control electrode T61 of a second light emitting control transistor T6, and a control electrode T71 of a second reset transistor T7), a light emitting control line EML, a scan line GL, a first reset control line (including a first reset control line RST1 electrically connected with a pixel circuit of a present row and a first reset control line RST1' electrically connected with a pixel circuit of a next row) and a first electrode Cst-1 of a storage capacitor Cst. Among them, a control electrode T11 of a first reset transistor T1 of the pixel circuit of the present row, a control electrode of a second reset transistor of a pixel circuit of a previous row, and a first reset control line RST1 may be of an integral structure. The control electrode T21 of the threshold compensation transistor T2, the control electrode T41 of the data writing transistor T4, and the scan line GL may be of an integral structure. The control electrode T31 of the drive transistor T3 and the first electrode Cst-1 of the storage capacitor Cst may be of an integral structure. The control electrode T51 of the first light emitting control transistor T5, the control electrode T61 of the second light emitting control transistor T6, and the light emitting control line EML may be of an integral structure. A control electrode T71 of a second reset transistor T7 of the pixel circuit of the present row, a control electrode of a first reset transistor of the pixel circuit of the next row, and a first reset control line RST1' may be of an integral structure. However, this embodiment is not limited thereto.

In some exemplary embodiments, as shown in FIG. 4 to FIG. 6C, the second conductive layer of the display substrate may include a first initial signal line (for example, a first initial signal line INIT1a and a first initial signal line INIT1b), a second initial signal line (for example, a second initial signal line INIT2a and a second initial signal line INIT2b), a second electrode Cst-2 of a storage capacitor Cst, and a shield electrode BK. The second electrode Cst-2 of the storage capacitor Cst has a hollow region. An orthographic projection of the control electrode T31 of the drive transistor T3 on the base substrate may covers an orthographic projection of the hollow region on the base substrate. The orthographic projection of the hollow region on the base substrate may be in a shape of a polygon. However, this embodiment is not limited thereto.

In some exemplary embodiments, as shown in FIG. 4 to FIG. 6D, the third insulation layer 103 of the display substrate is provided with a plurality of vias, which include, for example, a first via V1 to a fifteenth via V15. Among them, the third insulation layer 103, the second insulation layer 102, and the first insulation layer 101 within the first via V1 to the eighth via V8 are removed to expose a surface of the semiconductor layer 10. The third insulation layer 103 and the second insulation layer 102 within the ninth via V9 are removed to expose a surface of the first conductive layer 11. The third insulation layer 103 within the tenth via V10 to the fifteenth via V15 is removed to expose a surface of the second conductive layer 12.

In some exemplary implementation modes, as shown in FIG. 4 to FIG. 6D, the third conductive layer 13 of the display substrate may include a data line DL, a first power supply line PL1, and a plurality of connection electrodes (for example, a first connection electrode CP1 to a sixth connection electrode CP6). The data line DL may be connected with a first doped region of an active layer T40 of the data writing transistor T4 through the third via V3. The first power supply line PL1 may be electrically connected with the shield electrode BK through the twelfth via V12, and may also be electrically connected with the second electrode Cst-2 of the storage capacitor Cst through the thirteenth via V13. The shield electrode BK is configured to shield an influence of data voltage jump on a key node, avoid an influence of the data voltage jump on a potential of the key node of the pixel circuit, and improve a display effect. The first connection electrode CP1 may be electrically connected with a first doped region of an active layer T10 of the first reset transistor T1 through the first via V1, and may also be electrically connected with the first initial signal line INIT1a through the tenth via V10. The second connection electrode CP2 may be electrically connected with a first doped region of an active layer T20 of the threshold compensation transistor T2 through the second via V2, and may also be electrically connected with the control electrode T31 of the drive transistor T3 through the ninth via V9. The third connection electrode CP3 may be electrically connected with a second doped region of an active layer T60 of the second light emitting control transistor T6 through the fifth via V5. The fourth connection electrode CP4 may be electrically connected with a first doped region of an active layer T70 of the second reset transistor T7 through the sixth via V6, and may also be electrically connected with the second initial signal line INIT2b through the fifteenth via V15. The fifth connection electrode CP5 may be electrically connected with a first doped region of an active layer of a second reset transistor of a pixel circuit of a previous row through the seventh via V7, and may also be electrically connected with the second initial signal line INIT2a through the eleventh via V11. The sixth connection electrode CP6 may be electrically connected with a first doped region of an active layer of a first reset transistor of a pixel circuit of a next row through the eighth via V8, and may also be electrically connected with the first initial signal line INIT1b through the fourteenth via V14.

The above is only one example of the top view of the pixel circuit. However, this embodiment is not limited thereto.

In some exemplary implementation modes, as shown in FIG. 1, the first display region A1 may be provided with a plurality of first light emitting elements 21 and a plurality of pixel circuits and the second display region A2 may be provided with a plurality of second light emitting elements 22. The plurality of pixel circuits may include a plurality of first pixel circuits 31, a plurality of second pixel circuits 32, and a plurality of invalid pixel circuits. At least one first pixel circuit 31 may be electrically connected with at least one first light emitting element 21 through a first conductive line L1, and the at least one first pixel circuit 31 is configured to drive the at least one first light emitting element 21 to emit light. At least one second pixel circuit 32 may be electrically connected with at least one second light emitting element 22 through a second conductive line L2, and the at least one second pixel circuit 32 is configured to drive the at least one second light emitting element 32 to emit light. Disposing the invalid pixel circuits may be beneficial to improve uniformity of components of a plurality of film layers in an etching process. For example, an invalid pixel circuit has a same structure as a first pixel circuit 31 and a second pixel circuit 32 of a row or column in which the invalid pixel circuit is located, except that it is not connected with any light emitting element. In this example, a light transmission rate of the first display region A1 is less than a light transmission rate of the second display region A2. A pixel circuit is disposed only in the first display region A1, and no pixel circuit is disposed in the second display region A2, so that the light transmission rate of the second display region A2 may be improved.

In some examples, in order to improve a display effect, a density of second light emitting elements 22 of the second display region A2 may be less than or equal to a density of first light emitting elements 21 of the first display region A1. However, this embodiment is not limited thereto.

In some examples, a resolution of the first display region A1 may be less than or equal to that of the second display region A2. However, this embodiment is not limited thereto.

Figure 7:
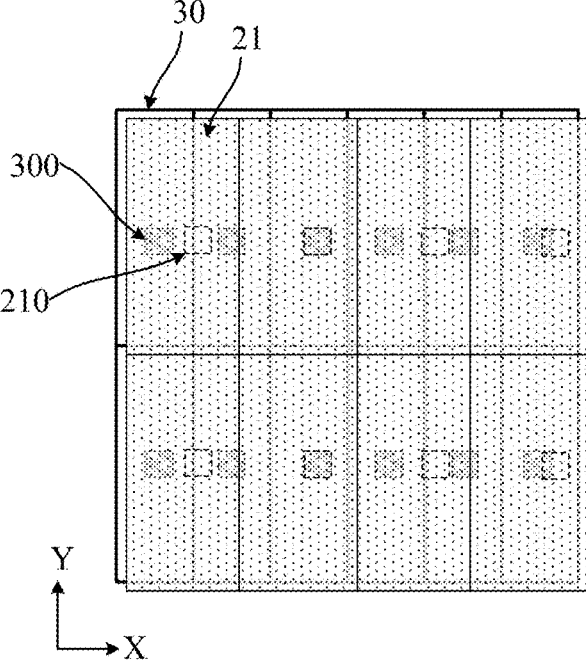
FIG. 7 is a partial schematic diagram of a first display region according to at least one embodiment of the present disclosure.

FIG. 7 is a partial schematic diagram of a first display region according to at least one embodiment of the present disclosure. Several first light emitting elements 21 and pixel circuits 30 of the first display region A1 are taken as an example for illustration in FIG. 7. In this example, a plurality of pixel circuits arranged sequentially along a row direction X may be referred to as a row of pixel circuits, and a plurality of pixel circuits arranged sequentially along a column direction Y may be referred to as a column of pixel circuits. The row direction X intersects with the second column Y, and for example, the row direction X may be perpendicular to the column direction Y.

In some exemplary implementation modes, as shown in FIG. 1 and FIG. 7, since the first display region A1 is provided not only with a first pixel circuit 31 electrically connected with a first light emitting element 21, but also with a second pixel circuit 32 electrically connected with a second light emitting element 22, a quantity of pixel circuits 30 of the first display region A1 is greater than a quantity of first light emitting elements 21. In this example, a region, in which a second pixel circuit is disposed, is obtained by reducing a size of a first pixel circuit in a first direction. For example, a size of a pixel circuit in the first direction may be smaller than a size of a first light emitting element in the first direction. In this example, the first direction may be the row direction X. As shown in FIG. 7, original pixel circuits of each a columns may be compressed along a horizontal direction X, thereby arrangement space of one column of pixel circuits is added, and space occupied by pixel circuits of a columns before compression is the same as space occupied by pixel circuits of (a+1) columns after compression. Among them, a may be an integer greater than 1. In this example, a may be equal to 2. However, this embodiment is not limited thereto. For example, a may be equal to 3 or 4. In other examples, the first direction may be the column direction Y. Original pixel circuits of b rows may be compressed along a vertical direction Y, thereby arrangement space of one row of pixel circuits is added, and space occupied by pixel circuits of b rows before compression is the same as space occupied by pixel circuits of (b+1) rows after compression. Among them, b may be an integer greater than 1. Or, a region, in which a second pixel circuit is disposed, may be obtained by reducing sizes of a first pixel circuit in a row direction and a column direction.

In the exemplary implementation modes, as shown in FIG. 7, one pixel circuit 30 may be electrically connected with a first light emitting element 21 or a second light emitting element through a first connection hole 300, and the first light emitting element 21 may be electrically connected with a corresponding first pixel circuit through a second connection hole 210. For example, the first pixel circuit may be electrically connected with a first conductive line through the first connection hole 300, and the first conductive line may be electrically connected with the corresponding first light emitting element 21 through the second connection hole 210. A second pixel circuit may be electrically connected with a second conductive line through the first connection hole 300, and the second conductive line may extend to a second display region to be electrically connected with a second light emitting element in the second display region.

Figures 8, 9:
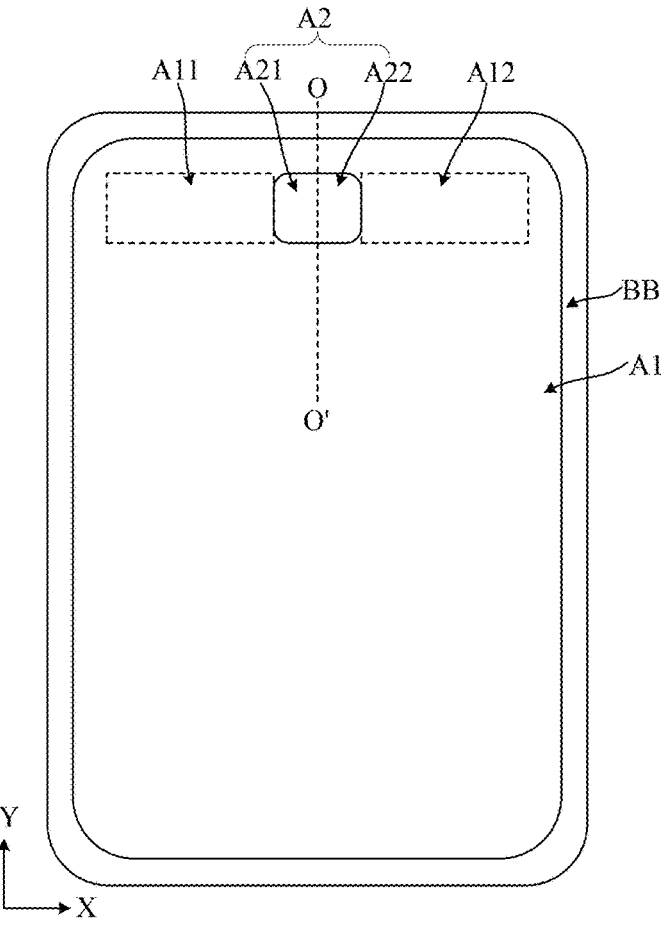
FIG. 8 is a schematic diagram of a display region according to at least one embodiment of the present disclosure.
FIG. 9 is a schematic diagram of a connection between a first display region and a second display region according to at least one embodiment of the present disclosure.

FIG. 8 is a schematic diagram of a display region according to at least one embodiment of the present disclosure. In some exemplary implementation modes, as shown in FIG. 8, a second display region A2 is substantially symmetrical about a central axis OO' in a row direction X. The second display region A2 may include a first partition A21 and a second partition A22, and the first partition A21 and the second partition A2 may be substantially symmetrical about the central axis OO'. A first display region A1 may include a first auxiliary region A11 adjacent to the first partition A21 of the second display region A2 in the row direction X, and a second auxiliary region A12 adjacent to the second partition A22 in the row direction X. A second pixel circuit electrically connected with a second light emitting element of the first partition A21 may be disposed in the first auxiliary region A11; and a second pixel circuit electrically connected with a second light emitting element of the second partition A22 may be disposed in the second auxiliary region A12.

Illustration is given below by taking a conductive line, between the first partition A21 and the first auxiliary region A11, electrically connecting a pixel circuit and a light emitting element as an example.

FIG. 9 is a schematic diagram of a connection between a second display region and a first display region according to at least one embodiment of the present disclosure. In some exemplary implementation modes, as shown in FIG. 8 and FIG. 9, the first partition A21 of the second display region A2 may include a plurality of second sub-display regions arranged sequentially along a side away from the first auxiliary region A11 in the row direction X, for example, include two second sub-display regions (i.e., M of this example may be 2). Among them, a first second sub-display region A2a may be located on a side of a second second sub-display region A2b away from the first auxiliary region A11. The first auxiliary region A11 of the first display region A1 may include a plurality of first sub-display regions arranged sequentially along a side away from the first partition A21 in the row direction X, for example, include a first first sub-display region A1a to a tenth first sub-display region A1j (i.e., N of this example may be 10), wherein the first first sub-display region A1a is closest to the first partition A21, and the tenth first sub-display region A1*j* is farthest from the first partition A21.

In this example, two adjacent first sub-display regions may be continuous regions, that is, no other pixel circuit or light emitting element may be disposed between the two adjacent first sub-display regions. The first first sub-display region A1*a* and the second second sub-display region A2*b* may be adjacent and continuous regions, that is, there may be no other region spaced between the first first sub-display region A1*a* and the second second sub-display region A2*b*. In this example, second pixel circuits may be arranged immediately adjacent to the second display region A2. However, this embodiment is not limited thereto. In other examples, the first first sub-display region A1*a* and the second second sub-display region A2*b* may be discontinuous regions, for example, a first pixel circuit and a first light emitting element which do not belong to a first sub-display region may be disposed between the first first sub-display region A1*a* and the second second sub-display region A2*b*. An arrangement position of the second pixel circuits is not adjacent to the second display region A2, and the arrangement position of the second pixel circuits may be spaced from the second display region A2 by a distance.

In this example, description is given by taking a case that a first conductive line electrically connecting a first light emitting element and a first pixel circuit is a transparent conductive line and a second conductive line electrically connecting a second light emitting element and a second pixel circuit is a transparent conductive line as an example. For example, the second conductive line may include a first transparent conductive line 52*a* and a second transparent conductive line 52*b*; and the first conductive line may include a third transparent conductive line 51*a* to a twelfth transparent conductive line 51*j*.

In some exemplary implementation modes, as shown in FIG. 9, a second light emitting element of a first second sub-display region A2*a* may be electrically connected with a second pixel circuit of a first first sub-display region A1*a* through the first transparent conductive line 52*a*. A second light emitting element of a second second sub-display region A2*b* may be electrically connected with a second pixel circuit of a second second sub-display region Alb through the second transparent conductive line 52*b*. In this example, a second light emitting element within a second sub-display region (e.g., the second sub-display region A2*a*) away from the first auxiliary region A11 may be electrically connected with a second pixel circuit within a first sub-display region (e.g., the first sub-display region A1*a*) close to the first partition A21, and a second light emitting element within a second sub-display region (e.g., the second sub-display region A2*b*) close to the first auxiliary region A11 may be electrically connected with a second pixel circuit within a first sub-display region (e.g., the first sub-display region Alb) away from the first partition A21. In this way, a situation that a length difference of transparent conductive lines electrically connected with second light emitting elements in different regions is too large may be better improved. However, this embodiment is not limited thereto. In other examples, a second light emitting element within a second sub-display region (e.g., the second sub-display region A2*a*) away from the first auxiliary region A11 may be electrically connected with a second pixel circuit of a first sub-display region (e.g., the first sub-display region Alb) away from the first partition A21, and a second light emitting element of a second sub-display region (e.g., the second sub-display region A2*b*) close to the first auxiliary region A11 may be electrically connected with a second pixel circuit within a first sub-display region (e.g., the first sub-display region A1*a* close to the first partition A21.

In some exemplary implementation modes, as shown in FIG. 9, a first light emitting element of a first first sub-display region A1*a* may be electrically connected with a first pixel circuit of a third first sub-display region A1*c* through the third transparent conductive line 51*a*. A first light emitting element of a second first sub-display region A1*b* may be electrically connected with a first pixel circuit of a fourth first sub-display region A1*d* through the fourth transparent conductive line 51*b*. A first light emitting element of the third first sub-display region A1*c* may be electrically connected with a first pixel circuit of a fifth first sub-display region A1*e* through the fifth transparent conductive line 51*c*. A first light emitting element of the fourth first sub-display region A1*d* may be electrically connected with a first pixel circuit of a sixth first sub-display region A1*f* through the sixth transparent conductive line 51*d*. A first light emitting element of the fifth first sub-display region Ale may be electrically connected with a first pixel circuit of a seventh first sub-display region A1*g* through the seventh transparent conductive line 51*e*. A first light emitting element of the sixth first sub-display region A1*f* may be electrically connected with a first pixel circuit of an eighth first sub-display region A1*h* through the eighth transparent conductive line 51*f*. A first light emitting element of the seventh first sub-display region A1*g* may be electrically connected with a first pixel circuit of a ninth first sub-display region A1*i* through the ninth transparent conductive line 51*g*. A first light emitting element of the eighth first sub-display region A1*h* may be electrically connected with a first pixel circuit of a tenth first sub-display region A1*j* through the tenth transparent conductive line 51*h*. By analogy, a first light emitting element of the ninth first sub-display region A1*i* may be electrically connected with a first pixel circuit within a region away from the tenth first sub-display region A1*j* (for example, an eleventh first sub-display region may be disposed) through the eleventh transparent conductive line 51*i*, and a first light emitting element of the tenth first sub-display region A1*j* may be electrically connected with a first pixel circuit within a region away from the tenth first sub-display region A1*j* (for example, a twelfth first sub-display region may be disposed) through the twelfth transparent conductive line 51*j*, until first light emitting elements within the first auxiliary region A11 may all be electrically connected with first pixel circuits. A quantity of first sub-display regions is not limited in this example. In some examples, a quantity of first sub-display regions may be determined according to a quantity of pixel circuits or light emitting elements within the first sub-display regions, for example, a quantity of pixel circuits within a last first sub-display region may be less than or equal to 2. Or, in some examples, a quantity of first sub-display regions may be determined according to lengths of transparent conductive lines with which light emitting elements or pixel circuits within the first sub-display regions are electrically connected, for example, a length of a transparent conductive line with which a light emitting element within a last first sub-display region is electrically connected is less than or equal to a preset value. However, this embodiment is not limited thereto.

In this example, a first light emitting element of an n-th first sub-display region is electrically connected with a first pixel circuit of an (n+2)-th first sub-display region, that is, i of this example may be 2. However, this embodiment is not limited thereto. In other examples, the first light emitting element of the first first sub-display region A1*a* may be electrically connected with the first pixel circuit of the fourth first sub-display region A1*d*, and the first light emitting element of the second first sub-display region A1b may be electrically connected with the first pixel circuit of the third first sub-display region A1*d*, and so on.

In some exemplary implementation modes, as shown in FIG. 9, pixel circuits within the first first sub-display region A1*a* and the second first sub-display region A1b may all be second pixel circuits so as to drive second light emitting elements within the first partition A21. Pixel circuits within the third first sub-display region A1*c* to the tenth first sub-display region A1*j* may all be first pixel circuits so as to drive first light emitting elements. In this example, by centrally disposing a second pixel circuit at a position close to the second display region A2, and performing a partition dislocation connection between a first pixel circuit and a first light emitting element, a length of a transparent conductive line electrically connecting a second pixel circuit and a second light emitting element may be reduced, and a situation that a length difference of transparent conductive lines is too large may be improved, thereby improving uniformity of a display effect.

Figure 10:
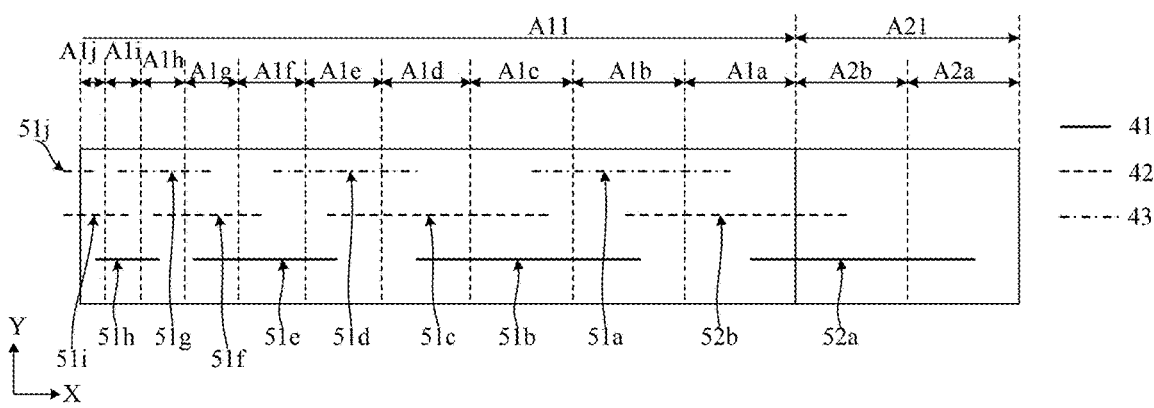
FIG. 10 is an example diagram of a transparent conductive line according to at least one embodiment of the present disclosure.

FIG. 10 is an example diagram of a transparent conductive line according to at least one embodiment of the present disclosure. In some exemplary implementation modes, as shown in FIG. 10, a display substrate may include a plurality of transparent conductive layers located on a side of a pixel circuit away from a base substrate, for example, include three transparent conductive layers, namely a first transparent conductive layer 41, a second transparent conductive layer 42, and a third transparent conductive layer 43. In some examples, the second transparent conductive layer 42 may be located on a side of the first transparent conductive layer 41 away from the base substrate, and the third transparent conductive layer 43 may be located on a side of the second transparent conductive layer 42 away from the base substrate. Any one of the transparent conductive layers may include a plurality of transparent conductive lines. For example, the first transparent conductive layer 41 and the second transparent conductive layer 42 may each include a plurality of first conductive lines electrically connecting first light emitting elements and first pixel circuits, and a plurality of second conductive lines electrically connecting second light emitting elements and second pixel circuits. The third transparent conductive layer 43 may include a plurality of first conductive lines electrically connecting first light emitting elements and first pixel circuits. However, this embodiment is not limited thereto. For example, the second conductive lines electrically connecting the second light emitting elements and the second pixel circuits may be disposed in the second transparent conductive layer and the third transparent conductive layer, or may be disposed in the first transparent conductive layer and the third transparent conductive layer.

In this example, transparent conductive lines of the first transparent conductive layer 41 are represented by solid lines, transparent conductive lines of the second transparent conductive layer 42 are represented by dotted lines, and transparent conductive lines of the third transparent conductive layer 43 are represented by dot and dash lines.

Figure 11A:
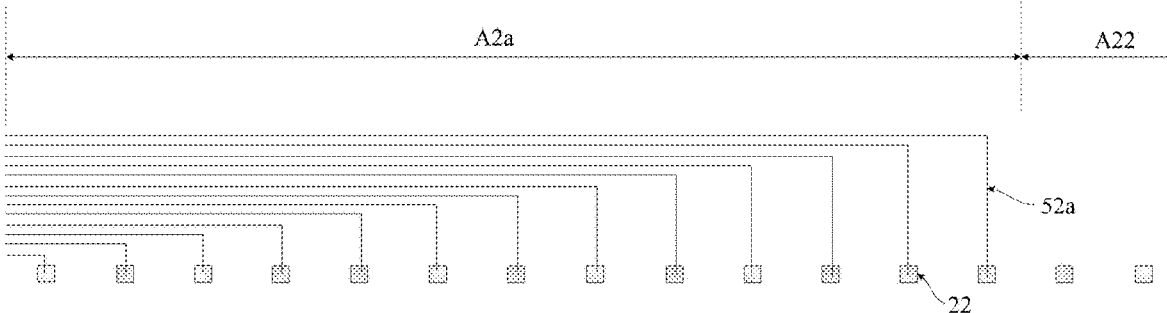
FIG. 11A is a schematic diagram of a connection of a transparent conductive line of a first second sub-display region according to at least one embodiment of the present disclosure.
Figure 11B:
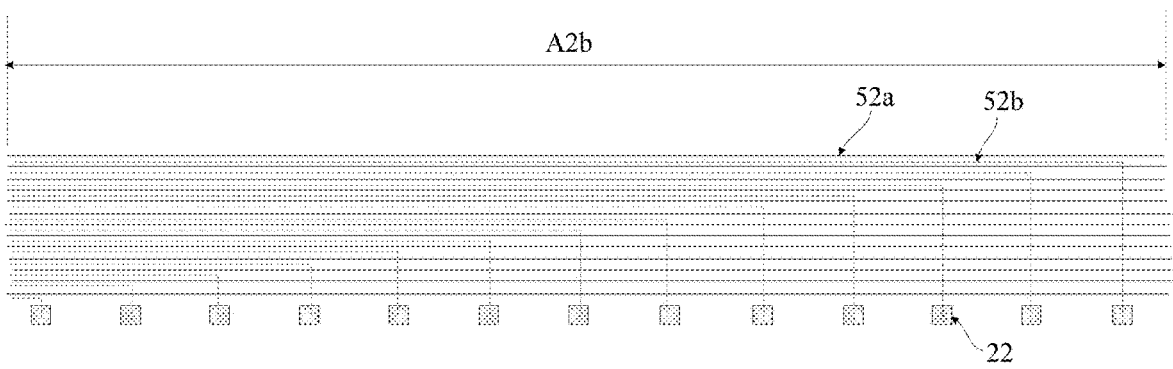
FIG. 11B is a schematic diagram of a connection of a transparent conductive line of a second second sub-display region according to at least one embodiment of the present disclosure.
Figure 11C:
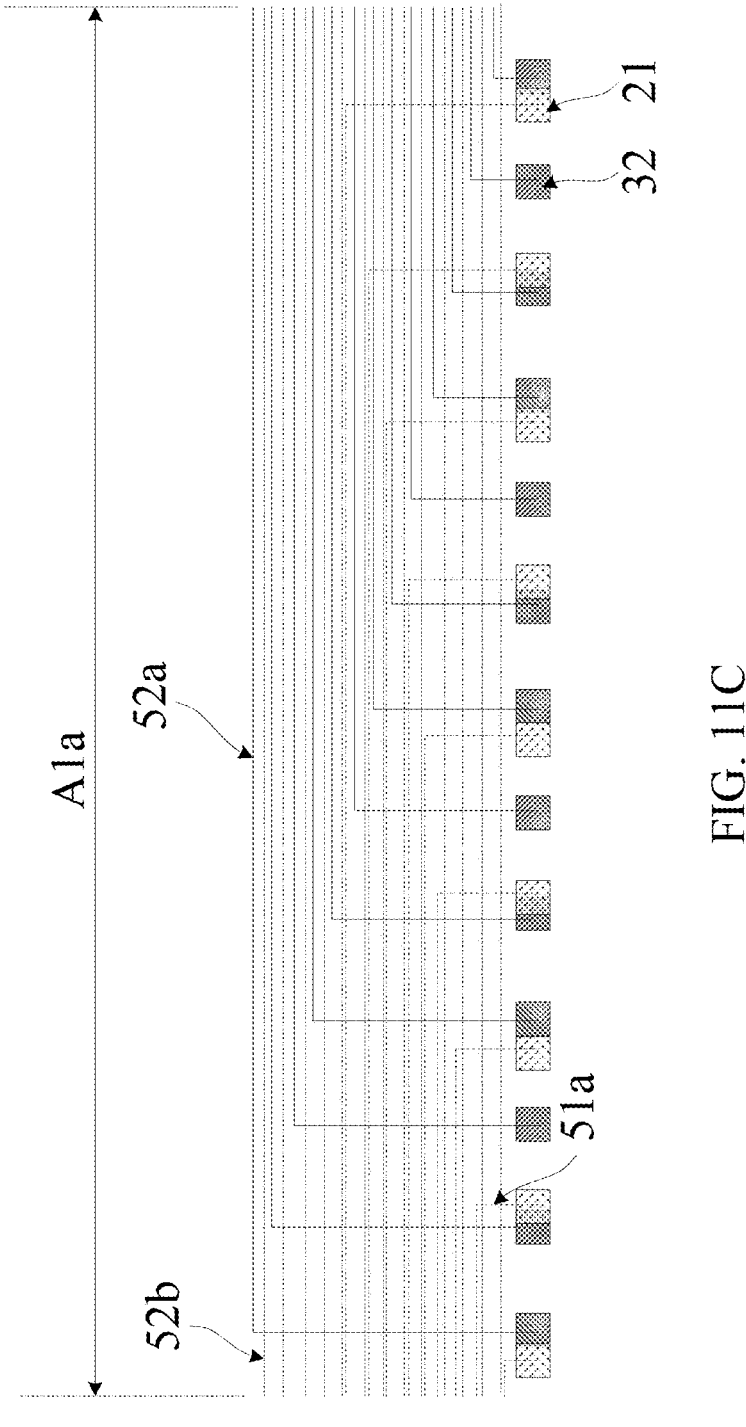
FIG. 11C is a schematic diagram of a connection of a transparent conductive line of a first first sub-display region according to at least one embodiment of the present disclosure.
Figure 11D:
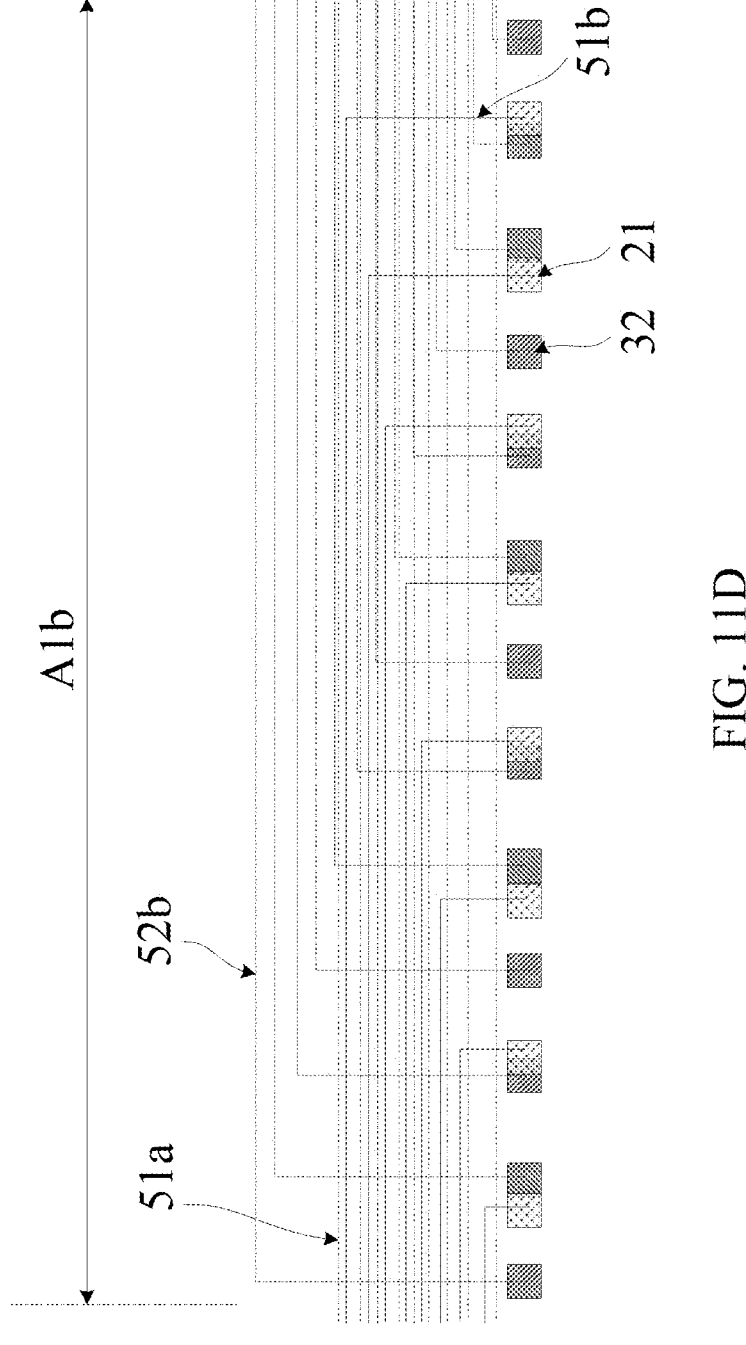
FIG. 11D is a schematic diagram of a connection of a transparent conductive line of a second first sub-display region according to at least one embodiment of the present disclosure.
Figure 11E:
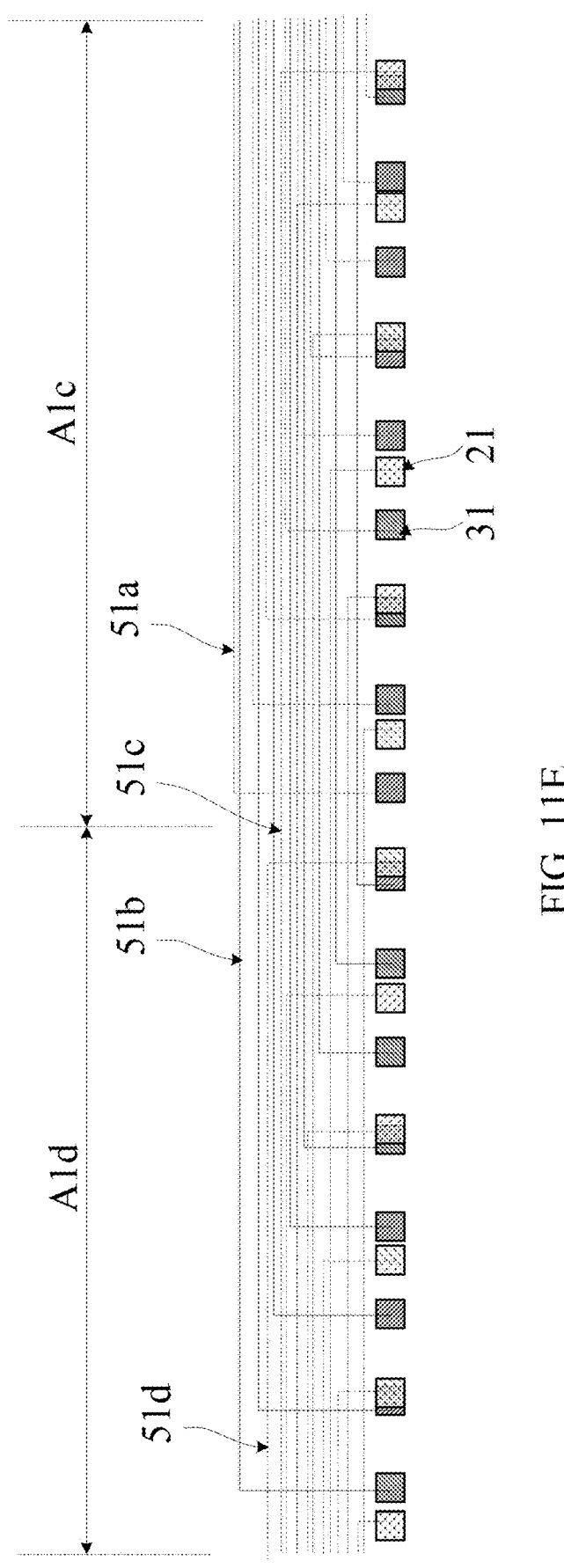
FIG. 11E is a schematic diagram of a connection of transparent conductive lines of a third first sub-display region and a fourth first sub-display region according to at least one embodiment of the present disclosure.
Figure 11F:
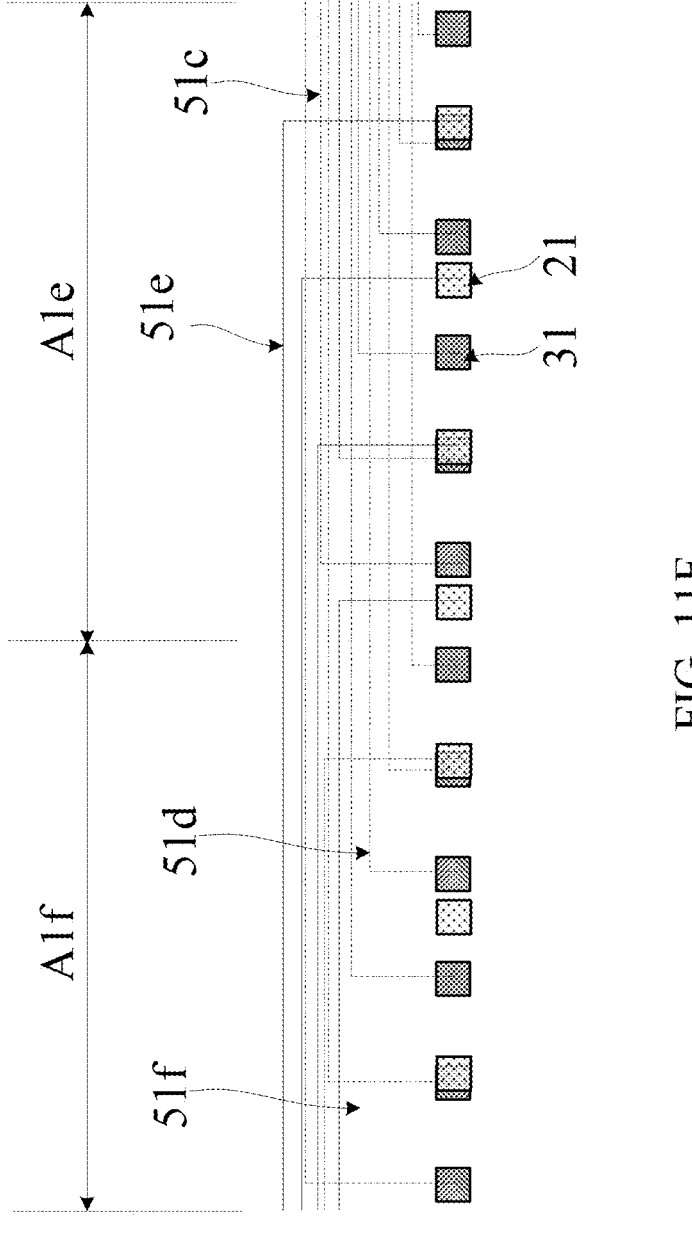
FIG. 11F is a schematic diagram of a connection of transparent conductive lines of a fifth first sub-display region and a sixth first sub-display region according to at least one embodiment of the present disclosure.
Figure 11G:
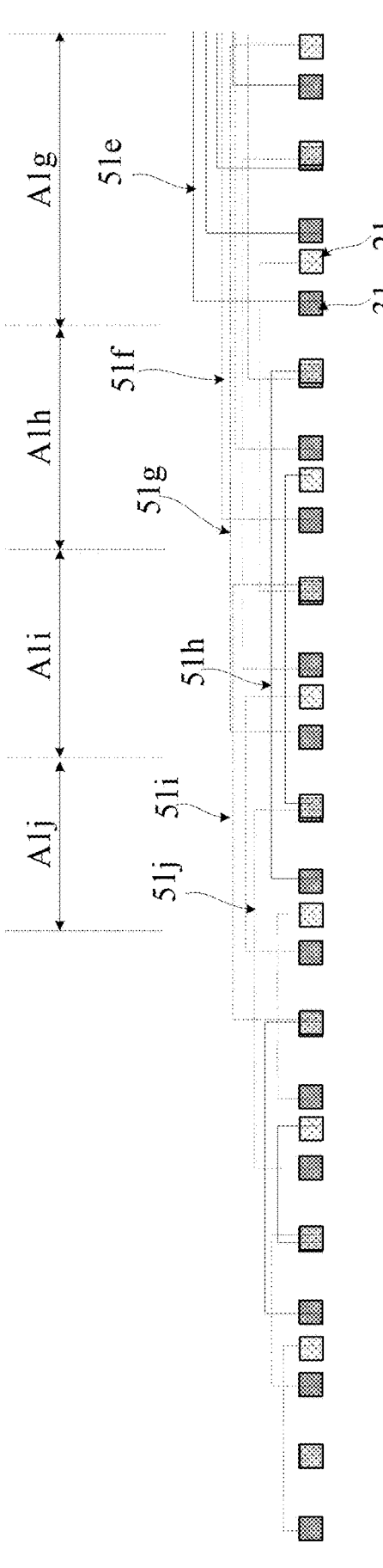
FIG. 11G is a schematic diagram of a connection of transparent conductive lines of a seventh first sub-display region to a tenth first sub-display region according to at least one embodiment of the present disclosure.

Description is given below with reference to FIG. 10 by taking a connection relationship between one row of pixel circuits and light emitting elements as an example. FIG. 11A is a schematic diagram of a connection of a transparent conductive line of a first second sub-display region according to at least one embodiment of the present disclosure. FIG. 11B is a schematic diagram of a connection of a transparent conductive line of a second second sub-display region according to at least one embodiment of the present disclosure. FIG. 11C is a schematic diagram of a connection of a transparent conductive line of a first first sub-display region according to at least one embodiment of the present disclosure. FIG. 11D is a schematic diagram of a connection of a transparent conductive line of a second first sub-display region according to at least one embodiment of the present disclosure. FIG. 11E is a schematic diagram of a connection of transparent conductive lines of a third first sub-display region and a fourth first sub-display region according to at least one embodiment of the present disclosure. FIG. 11F is a schematic diagram of a connection of transparent conductive lines of a fifth first sub-display region and a sixth first sub-display region according to at least one embodiment of the present disclosure. FIG. 11G is a schematic diagram of a connection of transparent conductive lines of a seventh first sub-display region to a tenth first sub-display region according to at least one embodiment of the present disclosure. In FIG. 11A to FIG. 11G, only a connection relationship between one row of pixel circuits and light emitting elements is illustrated.

In some exemplary implementation modes, as shown in FIG. 10 to FIG. 11D, a plurality of columns of second light emitting elements 22 are disposed within each of a first second sub-display region A2*a* and a second second sub-display region A2*b*. However, this embodiment is not limited thereto. For example, each second sub-display region may include only one column of second light emitting elements.

In some examples, as shown in FIG. 10 and FIG. 11D, a second light emitting element 22 within the first second sub-display region A2*a* may be electrically connected with a second pixel circuit 32 within a first first sub-display region A1b through a first transparent conductive line 52*a*. A plurality of first transparent conductive lines 52*a* with which a plurality of second light emitting elements 22 within the first second sub-display region A2*a* are electrically connected may all be located in a first transparent conductive layer 41. A first transparent conductive line 52*a* may extend from the first second sub-display region A2*a* to a first first sub-display region A1*a* through the second second sub-display region A2*b*. A second light emitting element 22 within the second second sub-display region A2*b* may be electrically connected with a second pixel circuit 32 within the second second sub-display region A1b through a second transparent conductive line 52*b*. A plurality of second transparent conductive lines 52*b* with which a plurality of second light emitting elements 22 within the second second sub-display region A2*b* are electrically connected may all be located in a second transparent conductive layer 42. A second transparent conductive line 52*b* may extend from the second second sub-display region A2*b* to the second first sub-display region A1b through the first first sub-display region A1*a*.

In some exemplary implementation modes, as shown in FIG. 10 to FIG. 11D, a second light emitting element 22 within the first second sub-display region A2*a* away from the first auxiliary region A11 may be electrically connected with a second pixel circuit 32 within the first first sub-display region A1*a* away from the second display region A2, and a second light emitting element 22 within the first second sub-display region A2*a* close to the first auxiliary region A11 may be electrically connected with a second pixel circuit 32 within the first first sub-display region A1*a* close to the second display region A2. A second light emitting element 22 within the second second sub-display region A2*b* away from the first auxiliary region A11 may be electrically connected with a second pixel circuit 32 within the second first sub-display region Alb away from the second display region A2, and a second light emitting element 22 within the second second sub-display region A2b close to the first auxiliary region A11 may be electrically connected with a second pixel circuit 32 within the second first sub-display region Alb close to the second display region A2. A connection mode of a second light emitting element 22 and a second pixel circuit 32 in this example may avoid problems such as short circuit or interference caused by overlapping of transparent conductive lines.

In some exemplary implementation modes, as shown in FIG. 11A to FIG. 11D, a quantity of second pixel circuits 32 within the first first sub-display region A1a may be the same as a quantity of second light emitting elements 22 within the first second sub-display region A2a, and a quantity of second pixel circuits 32 within the second first sub-display region Alb may be the same as a quantity of second light emitting elements 22 within the second second sub-display region A2b. In some examples, the quantity of the second light emitting elements 22 within the first second sub-display region A2a may be substantially the same as the quantity of the second light emitting elements 22 within the second second sub-display region A2b. The quantity of the second pixel circuits 32 within the first first sub-display region A1a may be substantially the same as the quantity of the second pixel circuits 32 within the second first sub-display region Alb. However, this embodiment is not limited thereto. For example, the quantity of the second light emitting elements 22 within the first second sub-display region A2a may be different from the quantity of the second light emitting elements 22 within the second second sub-display region A2b. The quantity of the second pixel circuits 32 within the first first sub-display region A1a may be different from the quantity of the second pixel circuits 32 within the second first sub-display region Alb.

In some exemplary implementation modes, as shown in FIG. 10 to FIG. 11E, the first first sub-display region A1a and the second first sub-display region Alb may each include a plurality of columns of second pixel circuits 32 and a plurality of columns of first light emitting elements 21. Since a size of a second pixel circuit 32 in a row direction X is smaller than a size of a first light emitting elements 21 in the row direction X, a quantity of first light emitting elements 21 within the first first sub-display region A1a is less than a quantity of second pixel circuits 32, and a quantity of first light emitting elements 21 within the second first sub-display region Alb is less than a quantity of second pixel circuits 32.

In some exemplary implementation modes, as shown in FIG. 10 to FIG. 11E, a first light emitting element 21 of the first first sub-display region A1a may be electrically connected with a first pixel circuit 31 of the third first sub-display region A1c through a third transparent conductive line 51a. A plurality of third transparent conductive lines 51a with which a plurality of first light emitting elements 21 within the first first sub-display region A1a are electrically connected may all be located in a third transparent conductive layer 43. A third transparent conductive line 51a may extend from the first first sub-display region A1a to the third first sub-display region A1c through the second first sub-display region Alb. A first light emitting element 21 within the second first sub-display region Alb may be electrically connected with a first pixel circuit 31 within the fourth second sub-display region A1d through a fourth transparent conductive line 51b. A plurality of fourth transparent conductive lines 51b with which a plurality of first light emitting elements 21 within the second first sub-display region Alb are electrically connected may all be located in a first transparent conductive layer 41. A fourth transparent conductive line 51b may extend from the second first sub-display region Alb to the fourth first sub-display region A1d through the third first sub-display region A1c.

In some exemplary implementation modes, as shown in FIG. 10 to FIG. 11E, a first light emitting element 21 within the first first sub-display region A1a close to the second display region A2 is electrically connected with a first pixel circuit 31 within the third first sub-display region A1c away from the second display region A2, and a first light emitting element 21 within the first first sub-display region A1a away from the second display region A2 is electrically connected with a first pixel circuit 31 within the third first sub-display region A1c close to the second display region A2. A first light emitting element 21 within the second first sub-display region Alb close to the second display region A2 is electrically connected with a first pixel circuit 31 within the fourth first sub-display region A1d away from the second display region A2, and a first light emitting element 21 within the second first sub-display region Alb away from the second display region A2 is electrically connected with a first pixel circuit 31 within the fourth first sub-display region A1d close to the second display region A2. A connection mode of a first light emitting element 21 and a first pixel circuit 31 in this example may avoid problems such as short circuit or interference caused by overlapping of transparent conductive lines.

In some examples, as shown in FIG. 10 to FIG. 11G, a fifth transparent conductive line 51c electrically connecting a first light emitting element 21 within the third first sub-display region A1c and a first pixel circuit 31 within the fifth first sub-display region Ale may be located in a second transparent conductive layer 42. A sixth transparent conductive line 51d electrically connecting a first light emitting element 21 within the fourth first sub-display region A1d and a first pixel circuit 31 within the sixth first sub-display region A1f may be located in a third transparent conductive layer 43. A seventh transparent conductive line 51e electrically connecting a first light emitting element 21 within the fifth first sub-display region Ale and a first pixel circuit 31 within the seventh first sub-display region A1g may be located in a first transparent conductive layer 41. An eighth transparent conductive line 51f electrically connecting a first light emitting element 21 within the sixth first sub-display region A1f and a first pixel circuit 31 within the eighth first sub-display region A1h may be located in the second transparent conductive layer 42. A ninth transparent conductive line 51g electrically connecting a first light emitting element 21 within the seventh first sub-display region A1g and a first pixel circuit 31 within the ninth first sub-display region A1i may be located in the third transparent conductive layer 43. A tenth transparent conductive line 51h electrically connecting a first light emitting element 21 within the eighth first sub-display region A1h and a first pixel circuit 31 within the tenth first sub-display region A1j may be located in the first transparent conductive layer 41. An eleventh transparent conductive line 51i with which a first light emitting element 21 of the ninth first sub-display region A1i is electrically connected may be located in the second transparent conductive layer 42, and a twelfth transparent conductive line 51j with which a first light emitting element 21 of the tenth first sub-display region A1j is electrically connected may be located in the third transparent conductive layer 43. A connection mode of a first light emitting element 21 of one first sub-display region and a first pixel circuit 31 of another first sub-display region may be referred to the connection mode of the second light emitting element 22 and the second pixel circuit 32, and therefore will not be repeated here.

In this example, pixel circuits within the first first sub-display region Alb and the second first sub-display region Alb may all be second pixel circuits. ixel circuits within the third first sub-display region A1c to the tenth first sub-display region A1j may all be first pixel circuits. By centrally disposing second pixel circuits together and close to the second display region, a length of a transparent conductive line electrically connecting a second light emitting element and a second pixel circuit may be reduced.

In this example, a quantity of first light emitting elements within any first sub-display region may be less than or equal to a quantity of first light emitting element within an adjacent first sub-display region on a side of the first sub-display region close to the second display region. For example, a quantity of first light emitting elements 21 within the second first sub-display region Alb may be less than a quantity of first light emitting elements within the first first sub-display region A1a, and a quantity of first light emitting elements 21 within the third first sub-display region A1c may be less than a quantity of first light emitting elements within the second first sub-display region A1a. In this example, a size of a first sub-display region may decrease along a side away from the first partition A21.

In this example, pixel circuits with the third first sub-display region A1c and pixel circuits within a first sub-display region on a side of the third first sub-display region A1c away from the second display region may all be first pixel circuits. A quantity of first pixel circuits 31 within the third first sub-display region A1c may be less than a quantity of first pixel circuits 31 within the first first sub-display region A1a. In the third first sub-display region A1c to the tenth first sub-display region A1j, a quantity of first pixel circuits 31 within any first sub-display region may be less than or equal to a quantity of first pixel circuits 31 within an adjacent first sub-display region on a side of the first sub-display region close to the second display region.

In this example, transparent conductive lines with which a plurality of first light emitting elements 21 within one first sub-display region are electrically connected may be of a same-layer structure. A transparent conductive line electrically connected with a first light emitting element 21 within one first sub-display region and a transparent conductive line electrically connected with a pixel circuit within the first sub-display region may be of a different-layer structure. For example, a third transparent conductive line 51a with which a first light emitting element 21 within the first first sub-display region A1a is electrically connected may be located in a third transparent conductive layer, and a first transparent conductive line 52a with which a second pixel circuit 32 within the first first sub-display region A1a is electrically connected may be located in a first transparent conductive layer. In this way, mutual interference between transparent conductive lines may be reduced.

Figure 12:
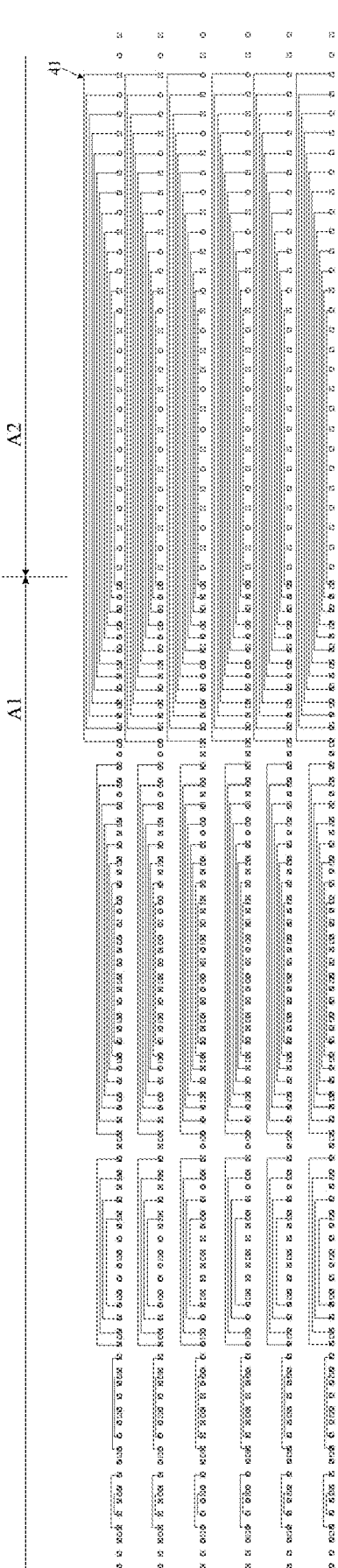
FIG. 12 is a schematic diagram of a first transparent conductive layer according to at least one embodiment of the present disclosure.
Figure 13:
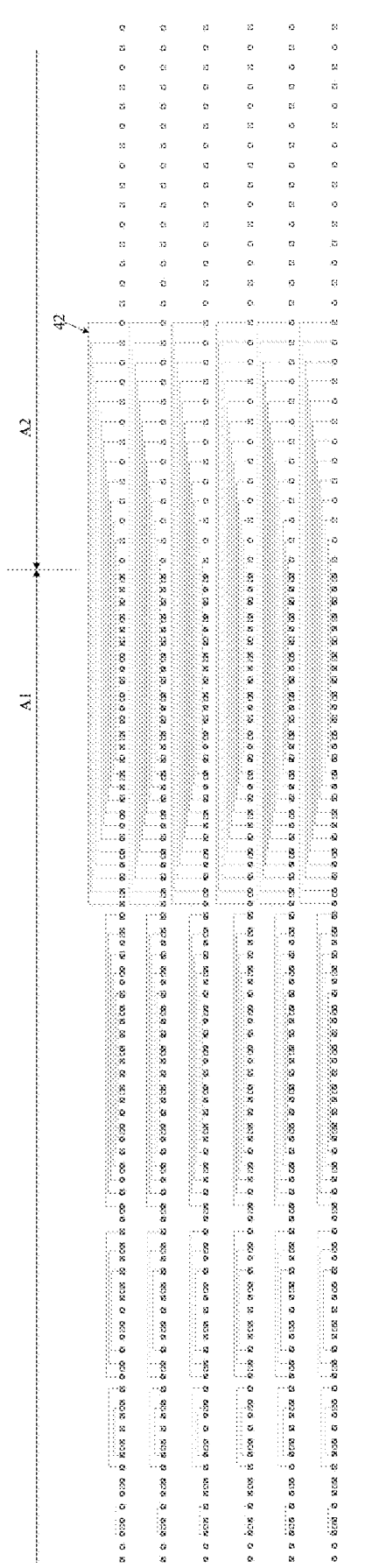
FIG. 13 is a schematic diagram of a second transparent conductive layer according to at least one embodiment of the present disclosure.
Figure 14:
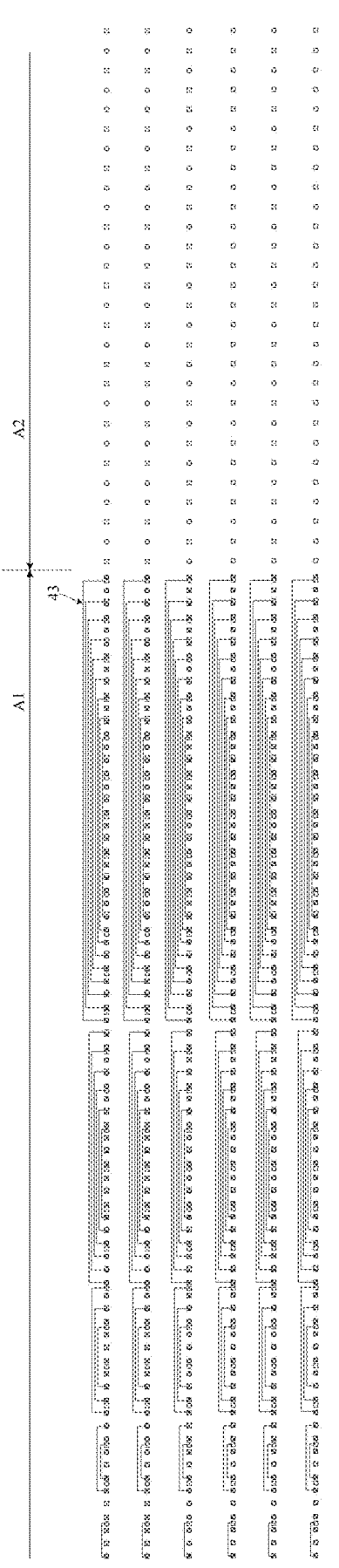
FIG. 14 is a schematic diagram of a third transparent conductive layer according to at least one embodiment of the present disclosure.
Figure 15:
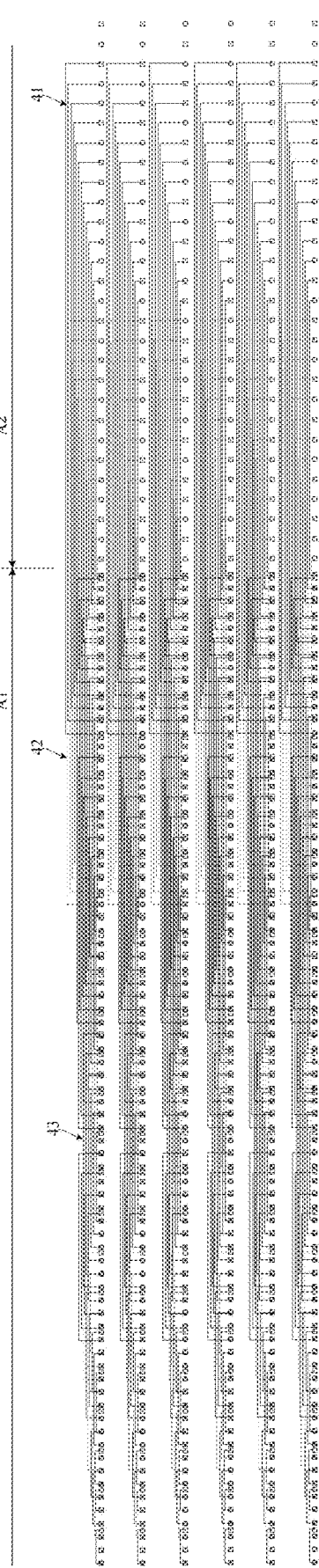
FIG. 15 is a schematic diagram of three transparent conductive layers according to at least one embodiment of the present disclosure.

FIG. 12 is a schematic diagram of a first transparent conductive layer according to at least one embodiment of the present disclosure. FIG. 13 is a schematic diagram of a second transparent conductive layer according to at least one embodiment of the present disclosure. FIG. 14 is a schematic diagram of a third transparent conductive layer according to at least one embodiment of the present disclosure. FIG. 15 is a schematic diagram of three transparent conductive layers according to at least one embodiment of the present disclosure. A connection relationship between a plurality of rows of pixel circuits and light emitting elements is illustrated in FIG. 12 to FIG. 15, and a connection relationship between a single row of pixel circuits and light emitting elements may be referred to FIG. 11A to FIG. 11G.

In some exemplary implementation modes, as shown in FIG. 10 to FIG. 15, a first transparent conductive line 52a, a fourth transparent conductive line 51b, a seventh transparent conductive line 51e, and a tenth transparent conductive line 51h may be located in a first transparent conductive layer 41. A second transparent conductive line 52b, a fifth transparent conductive line 51c, an eighth transparent conductive line 51f, and an eleventh transparent conductive line 51i may be located in a second transparent conductive layer 42. A third transparent conductive line 51a, a sixth transparent conductive line 51d, a ninth transparent conductive line 51g, and a twelfth transparent conductive line 51j may be located in a third transparent conductive layer 43. However, this embodiment is not limited thereto. For example, a first transparent conductive line 52a, a fourth transparent conductive line 51b, a seventh transparent conductive line 51e, and a tenth transparent conductive line 51h may be located in the second transparent conductive layer 42; a second transparent conductive line 52b, a fifth transparent conductive line 51c, an eighth transparent conductive line 51f, and an eleventh transparent conductive line 51i may be located in the third transparent conductive layer 43; and a third transparent conductive line 51a, a sixth transparent conductive line 51d, a ninth transparent conductive line 51g, and a twelfth transparent conductive line 51j may be located in the first transparent conductive layer 41. Or, in other examples the display substrate may include four transparent conductive layers. A first transparent conductive line 52a to a twelfth transparent conductive line 51j may be arranged in the four transparent conductive layers, respectively.

As shown in FIG. 10 to FIG. 15, a longest transparent conductive line in this example may be a first transparent conductive line 52a electrically connecting a second light emitting element farthest from the first display region A1 within the first second sub-display region A2a and a second pixel circuit farthest from the second display region A2 within the first first sub-display region A1a. Compared with some implementation modes in which a second light emitting element within a second sub-display region A2a is electrically connected with a second pixel circuit of a tenth first sub-display region through a transparent conductive line, this example may reduce a length of a transparent conductive line electrically connecting a second light emitting element 22 and a second pixel circuit 32, and improve a situation where a length difference between transparent conductive lines is too large, thereby improving a problem of poor picture uniformity in a under-screen display region and achieving a more uniform full-screen visual display effect.

In some exemplary implementation modes, as shown in FIG. 8, the second auxiliary region A12 of the first display region A1 may include a plurality of third sub-display regions arranged sequentially in a second direction (parallel to the row direction X in this example) along a side away from the second partition A22. The second partition A22 may include a plurality of fourth sub-display regions arranged sequentially in the second direction along a side away from the second auxiliary region A12. A second light emitting element within a fourth sub-display region may be electrically connected with a second pixel circuit within one third sub-display region through a second conductive line, and a first light emitting element within the third sub-display region may be electrically connected with a first pixel circuit within another third sub-display region on a side away from the second partition A22 through a first conductive line. In some examples, a connection mode between the second partition A22 and the second auxiliary region A12 may be obtained by mirroring a connection mode between the first partition A21 and the first auxiliary region A11 with respect to the central axis OO'. At this time, a quantity of third sub-display regions and a quantity of first sub-display regions may be the same, and a quantity of second sub-display regions and a quantity of fourth sub-display regions may be the same. In other examples, a connection mode between the second partition A22 and the second auxiliary region A12 may be obtained by referring to a connection law between the first partition A21 and the first auxiliary region A11. At this time, a quantity of third sub-display regions and a quantity of first sub-display regions may be different, a quantity of second sub-display regions and a quantity of fourth sub-display regions may be different, and a connection mode of pixel circuits and light emitting elements of the third sub-display regions and the fourth sub-display regions may be different from a connection mode of pixel circuits and light emitting elements of the first sub-display regions and the second sub-display regions. For example, a connection mode shown in FIG. 9 may be adopted for a first sub-display region and a second display region and a connection mode similar to FIG. 18 or FIG. 19 may be adopted for a third sub-display region and a fourth sub-display region. However, this embodiment is not limited thereto.

Exemplary description is made below for a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate using deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary implementation modes, the preparation process of the display substrate may include following operations.

(1) A semiconductor layer is formed.

In some exemplary implementation modes, forming a semiconductor layer may include: depositing a semiconductor thin film on a base substrate 100, and patterning the semiconductor thin film through a patterning process to form a semiconductor layer 10 in a first display region A1, as shown in FIG. 6A. Active layers of seven transistors of one pixel circuit may be of an integral structure connected with each other.

In some exemplary implementation modes, a material of the semiconductor layer 10 may include, for example, polysilicon. An active layer may include at least one channel region and a plurality of doped regions. The channel region may not be doped with an impurity, and has characteristics of a semiconductor. The plurality of doped regions may be on two sides of the channel region and doped with impurities, and thus have conductivity. An impurity may be changed according to a type of a transistor. In some examples, a doped region of an active layer may be interpreted as a source electrode or a drain electrode of a transistor. A part of an active layer between transistors may be interpreted as a wiring doped with an impurity, and may be used for electrically connecting the transistors.

In some exemplary implementation modes, the base substrate 100 may be a rigid substrate, e.g., a glass substrate. However, this embodiment is not limited thereto. For example, the base substrate may be a flexible substrate.

(2) A first conductive layer is formed.

In some exemplary implementation modes, a first insulation thin film and a first conductive thin film are sequentially deposited on the base substrate 100 where the aforementioned structure is formed, and the first conductive thin film is patterned through a patterning process to form a first insulation layer 101 covering the semiconductor layer and a first conductive layer 11 disposed on the first insulation layer 101 in the first display region A1, as shown in FIG. 6B.

(3) A second conductive layer is formed.

In some exemplary implementation modes, a second insulation thin film and a second conductive thin film are sequentially deposited on the base substrate 100 where the aforementioned structures are formed, and the second conductive thin film is patterned through a patterning process to form a second insulation layer 102 covering the first conductive layer 11 and a second conductive layer 12 disposed on the second insulation layer 102 in the first display region A1, as shown in FIG. 6C.

(4) A third insulation layer is formed.

In some exemplary implementation modes, a third insulation thin film is deposited on the base substrate 100 where the aforementioned patterns are formed, and the third insulation thin film is patterned through a patterning process to form a third insulation layer 103, as shown in FIG. 6D.

(5) A third conductive layer is formed.

In some exemplary implementation modes, a third conductive thin film is deposited on the base substrate where the aforementioned patterns are formed, and the third conductive thin film is patterned through a patterning process to form a third conductive layer 13 on the third insulation layer 103 in the first display region A1, as shown in FIG. 4.

So far, preparation of a pixel circuit of the first display region A1 is completed. A second display region A2 may include the base substrate 100, and the first insulation layer 101, the second insulation layer 102, and the third insulation layer 102 which are stacked on the base substrate 100.

(6) A first planarization layer, a first transparent conductive layer, a second planarization layer, a second transparent conductive layer, a third planarization layer, a third transparent conductive layer, a fourth planarization layer, an anode layer, a pixel definition layer, an organic emitting layer, and a cathode layer are formed sequentially.

In some exemplary implementation modes, a first planarization thin film is coated on the base substrate 100 where the aforementioned patterns are formed, and the first planarization thin film is patterned through a patterning process to form a first planarization layer. Subsequently, a first transparent conductive thin film is deposited on the base substrate where the aforementioned patterns are formed, and the first transparent conductive thin film is patterned through a patterning process to form a first transparent conductive layer. Subsequently, a second planarization thin film is coated on the base substrate where the aforementioned patterns are formed, and the second planarization thin film is patterned through a patterning process to form a second planarization layer. Subsequently, a second transparent conductive thin film is deposited on the base substrate where the aforementioned patterns are formed, and the second transparent conductive thin film is patterned through a patterning process to form a second transparent conductive layer. Subsequently, a third planarization thin film is coated on the base substrate where the aforementioned patterns are formed, and the third planarization thin film is patterned through a patterning process to form a third planarization layer. Subsequently, a third transparent conductive thin film is deposited on the base substrate where the aforementioned patterns are formed, and the third transparent conductive thin film is patterned through a patterning process to form a third transparent conductive layer. An arrangement of transparent conductive lines of the first transparent conductive layer, the second transparent conductive layer, and the third transparent conductive layer may be referred to FIG. 10 to FIG. 15.

Subsequently, an anode thin film is deposited on the base substrate where the aforementioned patterns are formed, and the anode thin film is patterned through a patterning process to form an anode layer. Subsequently, a pixel definition thin film is coated on the base substrate on which the aforementioned patterns are formed, and a pixel definition layer is formed through mask, exposure, and development processes. The pixel definition layer is formed with a plurality of pixel openings exposing the anode layer. Subsequently, an organic emitting layer is formed in the aforementioned pixel openings, and the organic emitting layer is connected with an anode. Subsequently, a cathode thin film is deposited, the cathode thin film is patterned through a patterning process to form a cathode layer, and the cathode layer is electrically connected with the organic emitting layer and a second power supply line respectively. In some examples, an encapsulation layer is formed on the cathode layer. The encapsulation layer may include a stacked structure of an inorganic material/an organic material/an inorganic material.

In some exemplary implementation modes, the first conductive layer 11, the second conductive layer 12, and the third conductive layer 13 may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer 101, the second insulation layer 102, and the third insulation layer 103 may be made of any one or more of Silicon Oxide (SiOx), Silicon Nitride (SiNx), and Silicon Oxynitride (SiON), and may be a single layer, a multi-layer, or a composite layer. The first insulation layer 101 and the second insulation layer 102 may be referred to as Gate Insulation (GI) layers, and the third insulation layer 103 may be referred to as an Interlayer Dielectric (ILD) layer. The first planarization layer to the fourth planarization layer may be made of an organic material, such as polyimide, acrylic, or polyethylene terephthalate. The pixel definition layer may be made of an organic material, such as polyimide, acrylic, or polyethylene terephthalate. The anode layer may be made of a reflective material such as a metal, and the cathode layer may be made of a transparent conductive material. However, this embodiment is not limited thereto.

A structure and the preparation process of the display substrate of this embodiment are merely illustrative. In some exemplary implementation modes, a corresponding structure may be changed and a patterning process may be increased or decreased according to actual needs. For example, a fourth insulation layer and the fourth conductive layer may be disposed on a side of the third conductive layer away from the base substrate, and the fourth conductive layer may include an anode connection electrode connecting a pixel circuit and a transparent conductive line. In some examples, a first conductive line electrically connecting a first light emitting element and a first pixel circuit may be disposed in the fourth conductive layer. In other examples, one or two transparent conductive layers may be disposed. However, this embodiment is not limited thereto.

The preparation process of this exemplary embodiment may be implemented using an existing mature preparation device, and may be compatible well with an existing preparation process, simple in process implementation, easy to implement, high in a production efficiency, low in a production cost, and high in a yield.

Figure 16:
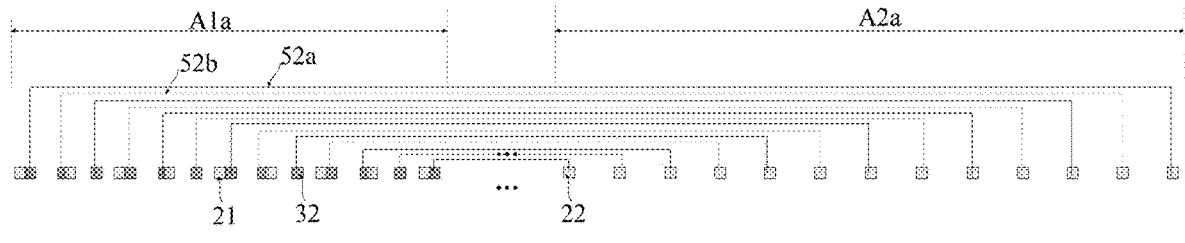
FIG. 16 is a schematic diagram of another connection between a first sub-display region and a second sub-display region according to at least one embodiment of the present disclosure.

FIG. 16 is a schematic diagram of another connection between a first sub-display region and a second sub-display region according to at least one embodiment of the present disclosure. In this example, a first second sub-display region A2*a* and a first first sub-display region A1*a* are taken as an example for illustration. As shown in FIG. 16, within the first second sub-display region A2*a*, second conductive lines electrically connected with adjacent second light emitting elements 22 may be of a different-layer structure. For example, one of the second light emitting elements 22 may be electrically connected with a second pixel circuit 32 within the first first sub-display region A1*a* through a thirteenth transparent conductive line 52*a*, and one second light emitting element 22 adjacent to the second light emitting element 22 in a row direction X may be electrically connected with another second pixel circuit 32 within the first first sub-display region A1*a* through a fourteenth transparent conductive line 52*b*. Among them, the thirteenth transparent conductive line 52*a* and the fourteenth transparent conductive line 52*b* may be of a different-layer structure, that is, located in different transparent conductive layers. For example, the thirteenth transparent conductive line 52*a* may be located in a first transparent conductive layer, the fourteenth transparent conductive line 52*b* may be located in a fourth transparent conductive layer, and the fourth transparent conductive layer may be located on a side of the third transparent conductive layer away from the base substrate. However, this embodiment is not limited thereto. In this example, a connection mode of a first light emitting element within one first sub-display region and a first pixel circuit within another first sub-display region may be similar to a connection mode of a second light emitting element 22 and a second pixel circuit 32 in this example, and therefore will not be repeated here.

Remaining connection modes of a pixel circuit and a light emitting element of the display substrate according to this embodiment may be referred to description of the aforementioned embodiments, and will not be repeated here.

Figure 17:
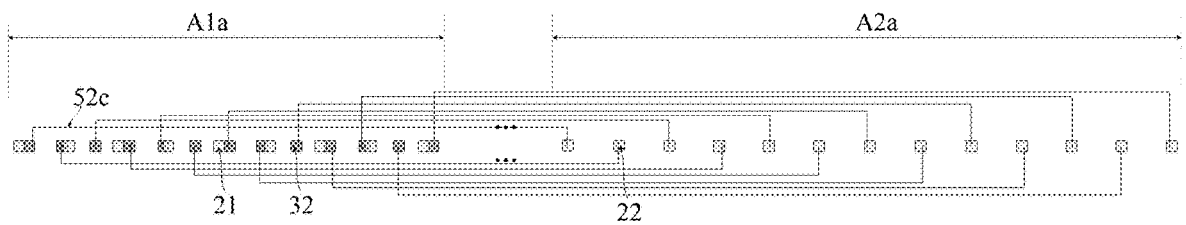
FIG. 17 is a schematic diagram of another connection between a first sub-display region and a second sub-display region according to at least one embodiment of the present disclosure.

FIG. 17 is a schematic diagram of another connection between a first sub-display region and a second sub-display region according to at least one embodiment of the present disclosure. In this example, the first second sub-display region A2*a* and the first first sub-display region A1*a* are taken as an example for illustration. As shown in FIG. 17, a second light emitting element 22 within the first second sub-display region A2*a* close to the first display region may be electrically connected with a second pixel circuit 32 within the first first sub-display region A1*a* away from the second display region, and a second light emitting element 22 within the first second sub-display region A2*a* away from the first display region may be electrically connected with a second pixel circuit 32 within the first first sub-display region A1*a* close to the second display region. Within the first second sub-display region A2*a*, a second light emitting element 22 may be electrically connected with a second pixel circuit 32 within the first first sub-display region A1*a* through a fifteenth transparent conductive line 52*c*. In some examples, the fifteenth transparent conductive line 52*c* may be formed by connecting a plurality of conductive line segments. The plurality of conductive line segments may be located in different transparent conductive layers. For example, one fifteenth transparent conductive line 52*c* may include a first conductive line segment located in a first transparent conductive layer, a second conductive line segment located in a second transparent conductive layer, and a third conductive line segment located in the first transparent conductive layer. The first conductive line segment may be electrically connected with a second light emitting element 22, the third conductive line segment may be electrically connected with a second pixel circuit 32, and the second conductive line segment may connect the first conductive line segment and the third conductive line segment. However, this embodiment is not limited thereto.

In this example, a connection mode of a first light emitting element within one first sub-display region and a first pixel circuit within another first sub-display region may be similar to a connection mode of a second light emitting element 22 and a second pixel circuit 32 in this example, and therefore will not be repeated here.

Remaining connection relationships of a pixel circuit and a light emitting element of the display substrate according to this embodiment may be referred to description of the aforementioned embodiments, and will not be repeated here.

Figure 18:
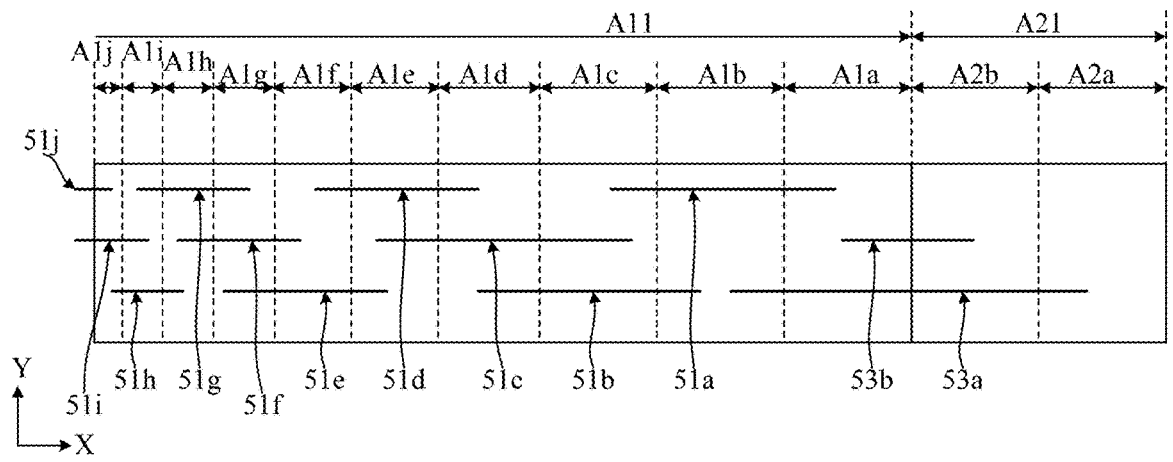
FIG. 18 is a schematic diagram of another connection between a first sub-display region and a second sub-display region according to at least one embodiment of the present disclosure.

FIG. 18 is a schematic diagram of another connection between a first sub-display region and a second sub-display region according to at least one embodiment of the present disclosure. As shown in FIG. 18, a second light emitting element of the first second sub-display region A2*a* may be electrically connected with a second pixel circuit of the second first sub-display region A1*b* through a sixteenth transparent conductive line 53*a*. A second light emitting element of the second second sub-display region A2*b* may be electrically connected with a second pixel circuit of the first second sub-display region A1*a* through a seventeenth transparent conductive line 53*b*. In some examples, the sixteenth transparent conductive line 53*a* and the seventeenth transparent conductive line 53*b* may be located in a same transparent conductive layer, for example, may be located in a first transparent conductive layer. However, this embodiment is not limited thereto. In other examples, the sixteenth transparent conductive line 53*a* and the seventeenth transparent conductive line 53*b* may be located in different transparent conductive layers.

Remaining connection relationships of a pixel circuit and a light emitting element of the display substrate according to this embodiment may be referred to description of the aforementioned embodiments, and will not be repeated here.

Figure 19:
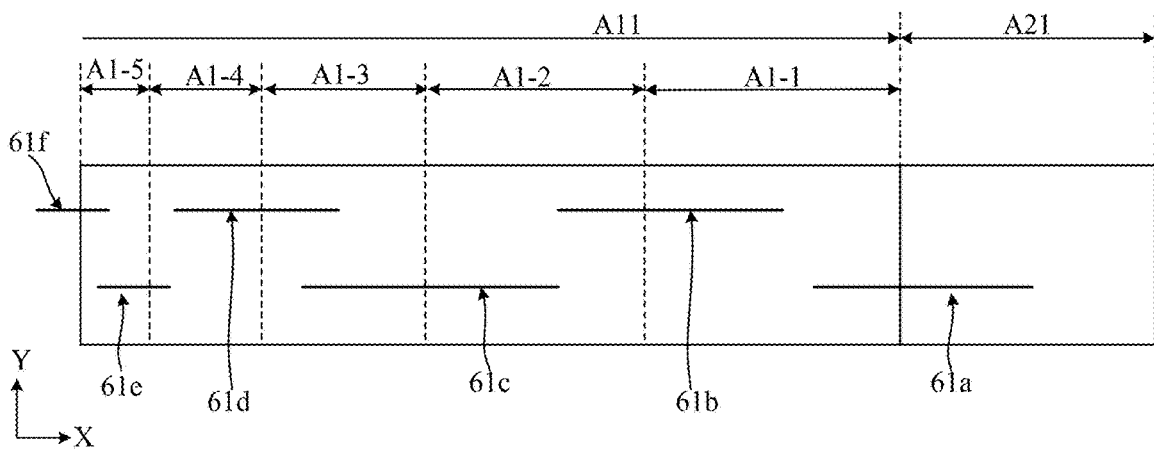
FIG. 19 is a schematic diagram of another connection between a first sub-display region and a second sub-display region according to at least one embodiment of the present disclosure.

FIG. 19 is a schematic diagram of yet another connection between a first sub-display region and a second sub-display region according to at least one embodiment of the present disclosure. In this example, as shown in FIG. 19, the first partition A21 of the second display region may be used as a second sub-display region as a whole. The first auxiliary region A11 adjacent to the second sub-display region may include a plurality of first sub-display regions (e.g., including a first first sub-display region A1-1 to a fifth first sub-display region A1-5 which are arranged sequentially along a side away from the first partition A21 in a row direction X). A second light emitting element within the first partition A21 may be electrically connected with a second pixel circuit within the first first sub-display region A1-1 through an eighteenth transparent conductive line 61*a*. A first light emitting element within the first first sub-display region A1-1 may be electrically connected with a first pixel circuit within the second first sub-display region A1-2 through a nineteenth transparent conductive line 61*b*. A first light emitting element within the second first sub-display region A1-2 may be electrically connected with a first pixel circuit within the third first sub-display region A1-3 through a twentieth transparent conductive line 61*c*. A first light emitting element within the third first sub-display region A1-3 may be electrically connected with a first pixel circuit of the fourth first sub-display region A1-4 through a twenty-first transparent conductive line 61*d*. A first light emitting element within the fourth first sub-display region A1-4 may be electrically connected with a first pixel circuit within the fifth first sub-display region A1-5 through a twenty-second transparent conductive line 61*e*. A first light emitting element within the fifth first sub-display region A1-5 may be electrically connected with a first pixel circuit within a region of the fifth first sub-display region A1-5 on a side away from the second display region through a twenty-third transparent conductive line 61*f*. In this example, a first light emitting element of one first sub-display region may be electrically connected with a first pixel circuit within an adjacent first sub-display region on a side away from the second display region. In this example, n may be 1, and i may be 1. Connection modes of light emitting elements and pixel circuits of different regions in this example may be referred to description of the aforementioned embodiments, and will not be repeated here.

In this example, a second conductive line may include an eighteenth transparent conductive line 61*a* and a nineteenth transparent conductive line 61*b*; and a first conductive line may include a twentieth transparent conductive line 61*c* to a twenty-third transparent conductive line 61*f*. The eighteenth transparent conductive line 61*a* and the nineteenth transparent conductive line 61*b* may be of a different-layer structure, that is, located in different transparent conductive layers. In this example, two transparent conductive layers may be disposed. For example, the eighteenth transparent conductive line 61*a*, the twentieth transparent conductive line 61*c*, and the twenty-second transparent conductive line 61*e* may be of a same-layer structure and be located in a first transparent conductive layer, and the nineteenth transparent conductive line 61*b*, the twenty-first transparent conductive line 61*d*, and the twenty-third transparent conductive line 61*f* may be of a same-layer structure and be located in a second transparent conductive layer. The second transparent conductive layer may be located on a side of the first transparent conductive layer away from the base substrate. However, this embodiment is not limited thereto. An arrangement of film layers of transparent conductive lines according to this embodiment may be referred to description of the aforementioned embodiments, and thus will not be repeated here.

Figure 20:
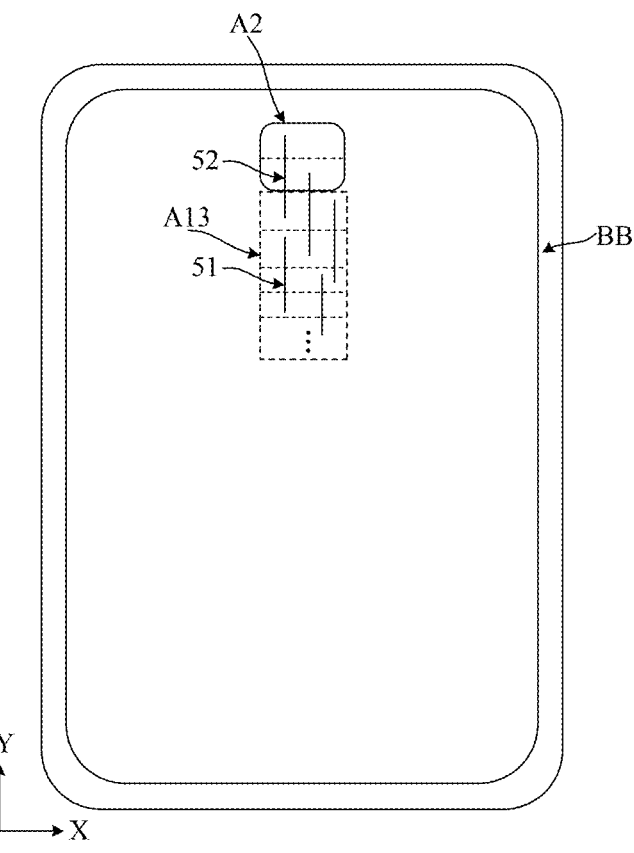
FIG. 20 is a schematic diagram of another connection between a first display region and a second display region according to at least one embodiment of the present disclosure.

FIG. 20 is a schematic diagram of another connection between a first display region and a second display region according to at least one embodiment of the present disclosure. In this example, a region, in which a second pixel circuit is disposed, may be obtained by reducing a size of a first pixel circuit in a column direction Y. In this example, a first direction may be the column direction Y. As shown in FIG. 20, the first display region A1 may include a third auxiliary region A13 adjacent to the second display region A2 in the column direction Y, and the third auxiliary region A13 may include a plurality of first sub-display regions disposed sequentially along a side away from the second display region A2 in the column direction Y. The second display region A2 may include a plurality of second sub-display regions divided along the column direction Y, for example, two second sub-display regions. A second light emitting element of a second sub-display region may be electrically connected with a second pixel circuit of a first sub-display region through a second conductive line 52, and a first light emitting element of the first sub-display region may be electrically connected with a first pixel circuit of another first sub-display region on a side away from the second display region A2 in the column direction Y through a first conductive line 51. A connection relationship between a first sub-display region and a second sub-display region and a connection mode between a pixel circuit and a light emitting element according to this embodiment may be referred to description of the aforementioned embodiments and be obtained by simple transform in direction, and thus will not be repeated here.

Figure 21:
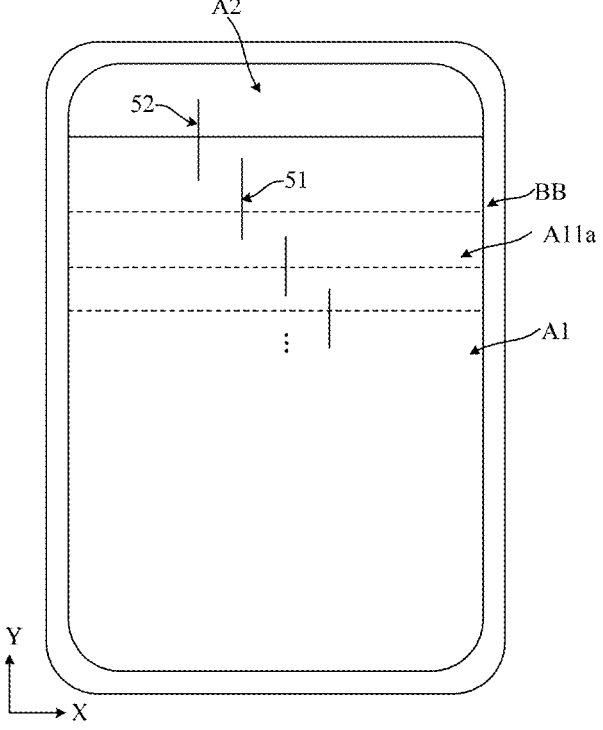
FIG. 21 is a schematic diagram of another connection between a first display region and a second display region according to at least one embodiment of the present disclosure.

FIG. 21 is a schematic diagram of another connection between a first display region and a second display region according to at least one embodiment of the present disclosure. In this example, as shown in FIG. 21, the second display region A2 may be located at a top of a display region, and be located on a side of the first display region A1 in a column direction Y. In some examples, a region, in which a second pixel circuit is disposed, may be obtained by reducing a size of a first pixel circuit in the column direction Y. However, this embodiment is not limited thereto.

In some examples, as shown in FIG. 21, the first display region A1 may include a plurality of first sub-display regions A11a disposed sequentially in a first direction (parallel to the column direction Y in this example) along a side away from the second display region A2. The second display region A2 may include a plurality of second sub-display regions divided along the column direction Y, or may be used as one second sub-display region as a whole. A second light emitting element within a second sub-display region may be electrically connected with a second pixel circuit within one first sub-display region A11a closest to the second display region A2 through a second conductive line 52, and a first light emitting element within this first sub-display region A11a may be electrically connected with a first pixel circuit within another first sub-display region A11a away from the second display region A2 through a first conductive line 51. A connection relationship between a first sub-display region and a second sub-display region and a connection mode between a pixel circuit and a light emitting element according to this embodiment may be referred to description of the aforementioned embodiments, and thus will not be repeated here.

Figure 22:
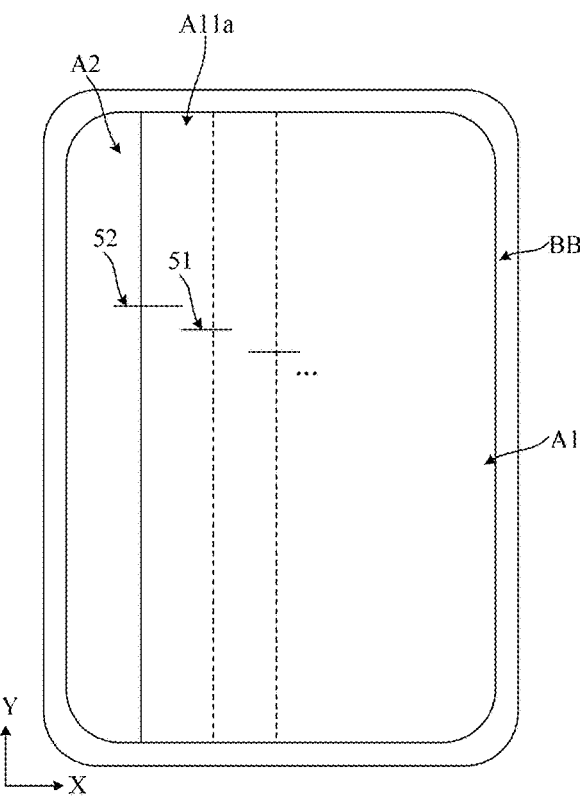
FIG. 22 is a schematic diagram of another connection between a first display region and a second display region according to at least one embodiment of the present disclosure.

FIG. 22 is a schematic diagram of another connection between a first display region and a second display region according to at least one embodiment of the present disclosure. In this example, as shown in FIG. 22, the second display region A2 may be located in a left half region of a display region, and be located on a side of the first display region A1 in a row direction X. In some examples, a region, in which a second pixel circuit is disposed, may be obtained by reducing a size of a first pixel circuit in the row direction X. However, this embodiment is not limited thereto.

In some examples, as shown in FIG. 22, the first display region A1 may include a plurality of first sub-display regions A11a disposed sequentially in a first direction (parallel to the row direction X in this example) along a side away from the second display region A2. The second display region A2 may include a plurality of second sub-display regions divided along the row direction X, or may be used as one second sub-display region as a whole. A second light emitting element within a second sub-display region may be electrically connected with a second pixel circuit within one first sub-display region A11a closest to the second display region A2 through a second conductive line 52, and a first light emitting element within this first sub-display region A11a may be electrically connected with a first pixel circuit within another first sub-display region A11a along a side away from the second display region A2 through a first conductive line 51. A connection relationship between a first sub-display region and a second sub-display region and a connection mode between a pixel circuit and a light emitting element according to this embodiment may be referred to description of the aforementioned embodiments, and thus will not be repeated here.

Figure 23:
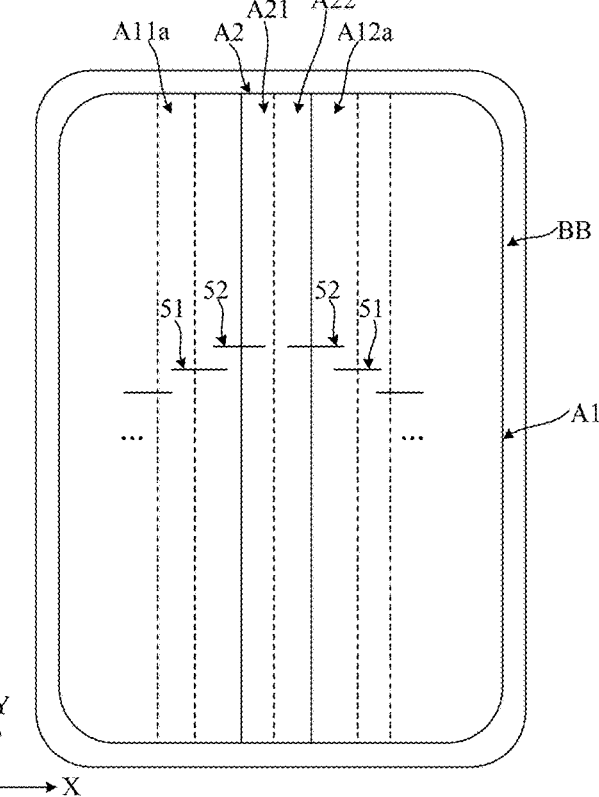
FIG. 23 is a schematic diagram of another connection between a first display region and a second display region according to at least one embodiment of the present disclosure.

FIG. 23 is a schematic diagram of another connection between a first display region and a second display region according to at least one embodiment of the present disclosure. In this example, as shown in FIG. 23, the second display region A2 may be located in a middle region of a display region, and adjacent to the first display region A1 on both sides in a row direction X. In some examples, a region, in which a second pixel circuit is disposed, may be obtained by reducing a size of a first pixel circuit in the row direction X. However, this embodiment is not limited thereto.

In some examples, as shown in FIG. 23, the second display region A2 may include a first partition A21 and a second partition A22 which are divided along the row direction X. The first partition A21 may include a plurality of second sub-display regions divided along a first direction (parallel to the row direction X in this example), or the first partition A21 may be used as one second sub-display region as a whole. The second partition A22 may include a plurality of fourth sub-display regions divided along a second direction (parallel to the row direction X in this example), or the second partition A22 may be used as one fourth sub-display region as a whole. In some examples, the first partition A21 and the second partition A22 may be substantially symmetrical with respect to a central axis of the second display region A2 in the row direction X. However, this embodiment is not limited thereto.

In some examples, as shown in FIG. 23, the first display region A1 may include a plurality of first sub-display regions A11a disposed sequentially along a side away from the first partition A21 in the first direction, and a plurality of third sub-display regions A12a disposed sequentially along a side away from the second partition A22 in the second direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51.

A connection relationship between a first sub-display region and a second sub-display region, a connection relationship between a third sub-display region and a fourth sub-display region, and a connection mode between a pixel circuit and a light emitting element according to this embodiment may be referred to description of the aforementioned embodiments, and thus will not be repeated here.

Figure 24:
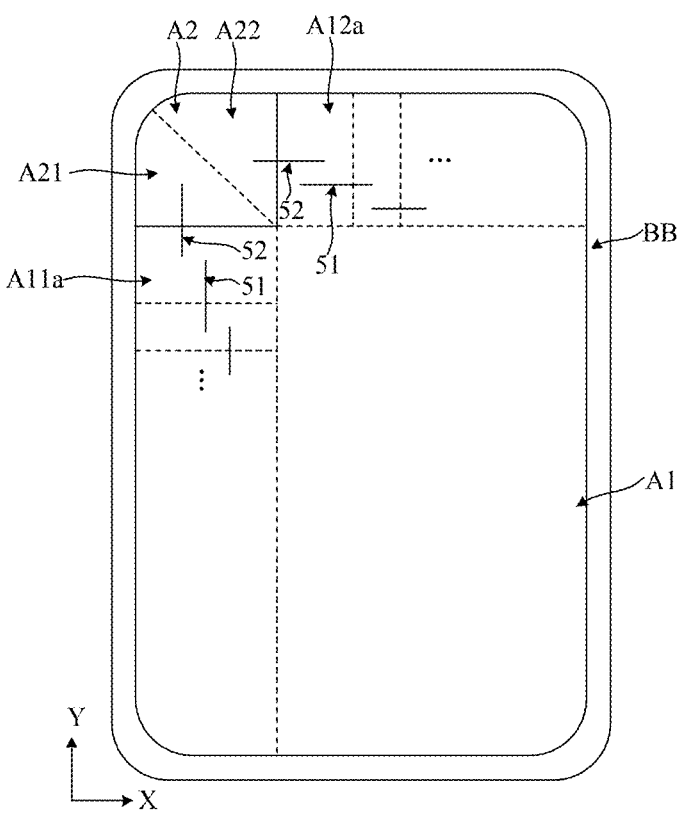
FIG. 24 is a schematic diagram of another connection between a first display region and a second display region according to at least one embodiment of the present disclosure.

FIG. 24 is a schematic diagram of another connection between a first display region and a second display region according to at least one embodiment of the present disclosure. In this example, as shown in FIG. 24, the second display region A2 may be located in an upper left corner of a display region, and the second display region A2 is adjacent to the first display region A1 in both a row direction X and a column direction Y. In some examples, a region, in which a second pixel circuit is disposed, may be obtained by reducing sizes of a first pixel circuit in the row direction X and the column direction Y. However, this embodiment is not limited thereto.

In some examples, as shown in FIG. 24, the second display region A2 may include a first partition A21 and a second partition A22. The first partition A21 may include a plurality of second sub-display regions divided along a first direction (parallel to the column direction Y in this example), or the first partition A21 is used as one second sub-display region as a whole. The second partition A22 may include a plurality of fourth sub-display regions divided along a second direction (parallel to the row direction X in this example), or the second partition A22 is used as one fourth sub-display region as a whole. In some examples, the first partition A21 and the second partition A22 may be substantially symmetrical with respect to a diagonal of the second display region A2. However, this embodiment is not limited thereto. For example, the first partition A21 and the second partition A22 may be substantially symmetrical with respect to a central axis of the second display region A2 in the row direction X or the column direction Y.

In some examples, as shown in FIG. 24, the first display region A1 may include a plurality of first sub-display regions A11a disposed sequentially along a side away from the first partition A21 in the first direction, and a plurality of third sub-display regions A12a disposed sequentially along a side away from the second partition A22 in the second direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51.

A connection relationship between a first sub-display region and a second sub-display region, a connection relationship between a third sub-display region and a fourth sub-display region, and a connection mode between a pixel circuit and a light emitting element according to this embodiment may be referred to description of the aforementioned embodiments, and thus will not be repeated here.

Figure 25:
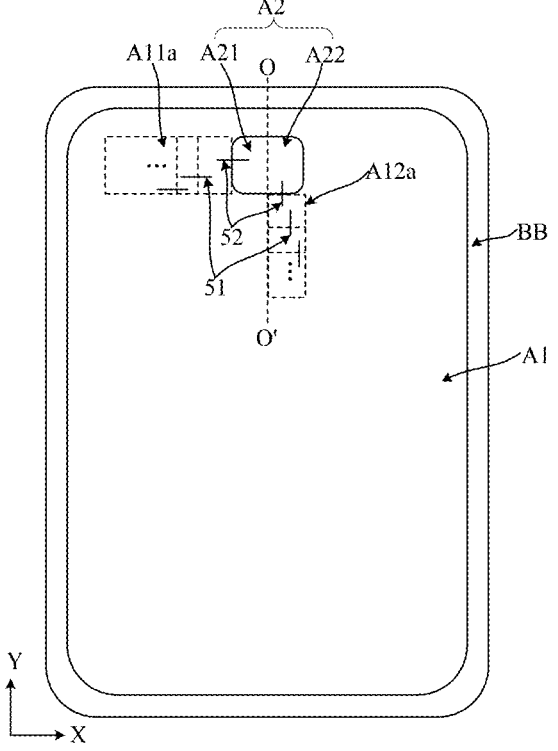
FIG. 25 is a schematic diagram of another connection between a first display region and a second display region according to at least one embodiment of the present disclosure.

FIG. 25 is a schematic diagram of another connection between a first display region and a second display region according to at least one embodiment of the present disclosure. In this example, as shown in FIG. 25, the second display region A2 may be located at a top central position of a display region, and the first display region A1 surrounds the second display region A2. In some examples, a region, in which a second pixel circuit is disposed, may be obtained by reducing sizes of a first pixel circuit in a row direction X and a column direction Y. As shown in FIG. 25, the second display region A2 may include a first partition A21 and a second partition A22, and the first partition A21 and the second partition A22 may be substantially symmetrical with respect to a central axis OO' of the second display region A2 in the row direction X. The first display region A1 may include a plurality of first sub-display regions A11a disposed sequentially in a first direction (parallel to the row direction X in this example) along a side away from the first partition A21, and a plurality of third sub-display regions A12a disposed sequentially in a second direction (parallel to the column direction Y in this example) along a side away from the second partition A22. The first partition A21 may include a plurality of second sub-display regions divided along the first direction, or the first partition A21 is used as one second sub-display region as a whole. The second partition A22 may include a plurality of fourth sub-display regions divided along the second direction, or the second partition A22 is used as one fourth sub-display region as a whole. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51. A connection relationship between a first sub-display region and a second sub-display region, a connection relationship between a third sub-display region and a fourth sub-display region, and a connection mode between a pixel circuit and a light emitting element according to this embodiment may be referred to description of the aforementioned embodiments, and thus will not be repeated here.

Figure 26:
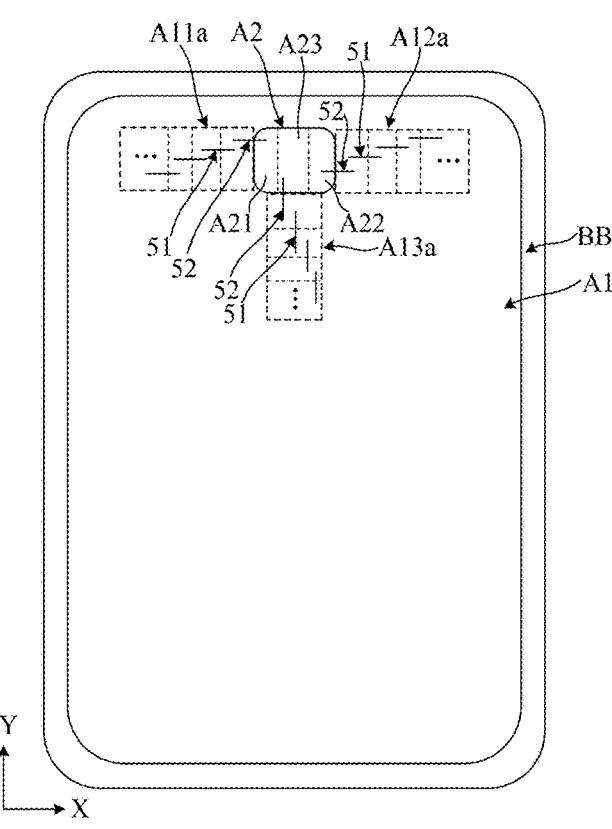
FIG. 26 is a schematic diagram of another connection between a first display region and a second display region according to at least one embodiment of the present disclosure.

FIG. 26 is a schematic diagram of another connection between a first display region and a second display region according to at least one embodiment of the present disclosure. In this example, as shown in FIG. 26, the second display region A2 may be located at a top central position of a display region, and the first display region A1 surrounds the second display region A2. In some examples, a region, in which a second pixel circuit is disposed, may be obtained by reducing sizes of a first pixel circuit in a row direction X and a column direction Y. As shown in FIG. 26, the second display region A2 may include a first partition A21, a second partition A22, and a third partition A23. For example, the first partition A21, the second partition A22, and the third partition A23 may be obtained by dividing the second display region A2 in the row direction X. However, this embodiment is not limited thereto. The first partition A21 may include a plurality of second sub-display regions divided along a first direction (parallel to the row direction X in this example), or the first partition A21 may be used as one second sub-display region as a whole. The second partition A22 may include a plurality of fourth sub-display regions divided along a second direction (parallel to the row direction X in this example), or the second partition A22 may be used as one fourth sub-display region as a whole. The third partition A23 may include a plurality of sixth sub-display regions divided along a third direction (parallel to the column direction Y in this example), or the third partition A23 may be used as one sixth sub-display region as a whole.

In some examples, as shown in FIG. 26, the first display region A1 may include a plurality of first sub-display regions A11a disposed sequentially along a side away from the first partition A21 in the first direction, a plurality of third sub-display regions A12a disposed sequentially along a side away from the second partition A22 in the second direction, and a plurality of fifth sub-display regions A13a disposed sequentially along a side away from the third partition A23 in the third direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51. A second light emitting element within a sixth sub-display region may be electrically connected with a second pixel circuit within one fifth sub-display region A13a closest to the third partition A23 through a second conductive line 52, and a first light emitting element within this fifth sub-display region A13a may be electrically connected with a first pixel circuit within another fifth sub-display region A13a along a side away from the third partition A23 through a first conductive line 51.

A connection relationship between a first sub-display region and a second sub-display region, a connection relationship between a third sub-display region and a fourth sub-display region, a connection relationship between a fifth sub-display region and a sixth sub-display region, and a connection mode between a pixel circuit and a light emitting element according to this embodiment may be referred to description of the aforementioned embodiments, and thus will not be repeated here.

Figure 27:
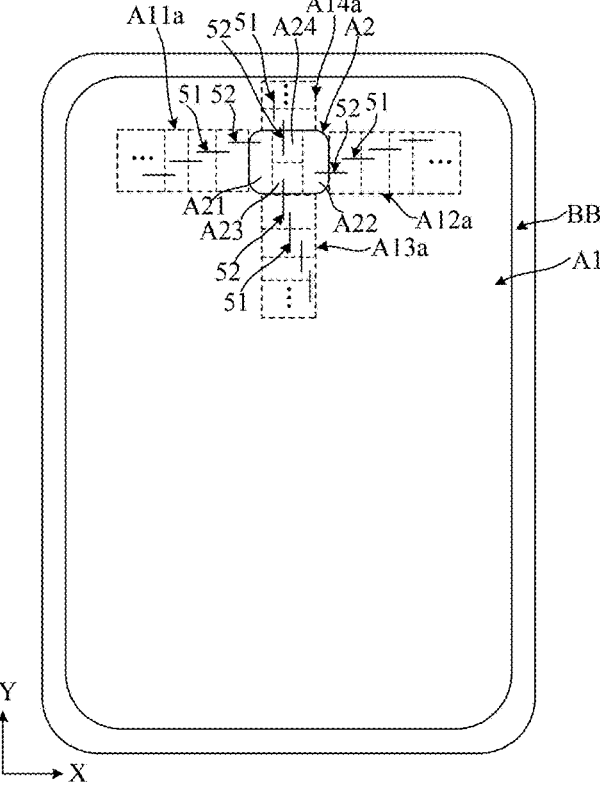
FIG. 27 is a schematic diagram of another connection between a first display region and a second display region according to at least one embodiment of the present disclosure.

FIG. 27 is a schematic diagram of another connection between a first display region and a second display region according to at least one embodiment of the present disclosure. In this example, as shown in FIG. 27, the second display region A2 may be located at a top central position of a display region, and the first display region A1 surrounds the second display region A2. In some examples, a region, in which a second pixel circuit is disposed, may be obtained by reducing sizes of a first pixel circuit in a column direction Y and a row direction X. However, this embodiment is not limited thereto.

In some examples, as shown in FIG. 27, the second display region A2 may include a first partition A21, a second partition A22, a third partition A23, and a fourth partition A24. For example, the first partition A21, the second partition A22, the third partition A23, and the fourth partition A24 may be obtained by dividing the second display region A2 in the row direction X and the column direction Y, or may be obtained by dividing the second display region A2 along a diagonal direction. However, this embodiment is not limited thereto. The first partition A21 may include a plurality of second sub-display regions divided along a first direction (parallel to the row direction X in this example), or the first partition A21 may be used as one second sub-display region as a whole. The second partition A22 may include a plurality of fourth sub-display regions divided along a second direction (parallel to the row direction X in this example), or the second partition A22 may be used as one fourth sub-display region as a whole. The third partition A23 may include a plurality of sixth sub-display regions divided along a third direction (parallel to the column direction Y in this example), or the third partition A23 may be used as one sixth sub-display region as a whole. The fourth partition A24 may include a plurality of eighth sub-display regions divided along a fourth direction (parallel to the column direction Y in this example), or the fourth partition A24 may be used as one eighth sub-display region as a whole.

In some examples, as shown in FIG. 27, the first display region A1 may include a plurality of first sub-display regions A11a disposed sequentially along a side away from the first partition A21 in the first direction, a plurality of third sub-display regions A12a disposed sequentially along a side away from the second partition A22 in the second direction, a plurality of fifth sub-display regions A13a disposed sequentially along a side away from the third partition A23 in the third direction, and a plurality of seventh sub-display regions A14a disposed sequentially along a side away from the fourth partition A24 in the fourth direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51. A second light emitting element within a sixth sub-display region may be electrically connected with a second pixel circuit within one fifth sub-display region A13a closest to the third partition A23 through a second conductive line 52, and a first light emitting element within this fifth sub-display region A13a may be electrically connected with a first pixel circuit within another fifth sub-display region A13a along a side away from the third partition A23 through a first conductive line 51. A second light emitting element within an eighth sub-display region may be electrically connected with a second pixel circuit within one seventh sub-display region A14a closest to the fourth partition A24 through a second conductive line 52, and a first light emitting element within this seventh sub-display region A14a may be electrically connected with a first pixel circuit within another seventh sub-display region A14a along a side away from the fourth partition A24 through a first conductive line 51.

A connection relationship between a first sub-display region and a second sub-display region, a connection relationship between a third sub-display region and a fourth sub-display region, a connection relationship between a fifth sub-display region and a sixth sub-display region, a connection relationship between a seventh sub-display region and an eighth sub-display region, and a connection mode between a pixel circuit and a light emitting element according to this embodiment may be referred to description of the aforementioned embodiments, and thus will not be repeated here.

Figure 28:
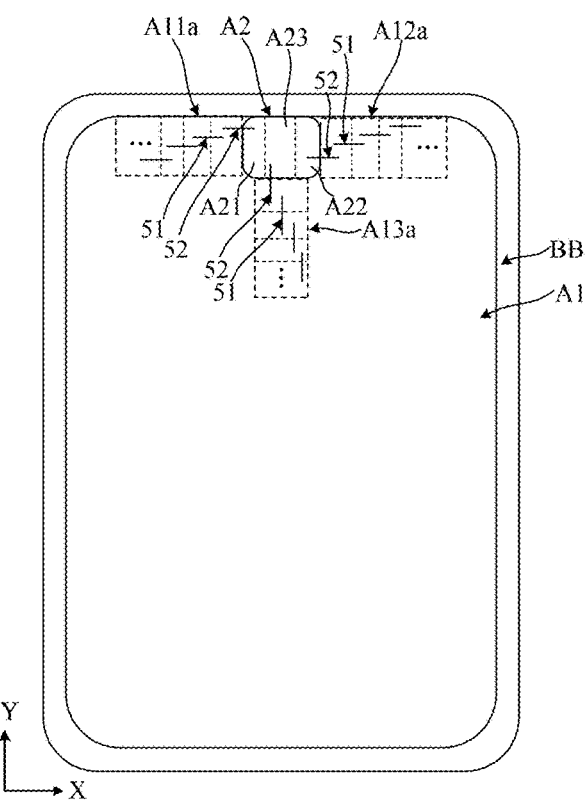
FIG. 28 is a schematic diagram of another connection between a first display region and a second display region according to at least one embodiment of the present disclosure.

FIG. 28 is a schematic diagram of another connection between a first display region and a second display region according to at least one embodiment of the present disclosure. In this example, as shown in FIG. 28, the second display region A2 may be located at a top central position of a display region, and the first display region A1 surrounds the second display region A2 on three sides. An upper side of the second display region A2 is directly adjacent to a peripheral region BB, and the first display region A1 surrounds a lower side, a left side, and a right side of the second display region A2. Region division and a connection relationship of the first display region and the second display region according to this embodiment may be referred to FIG. 26, and thus will not be repeated here.

Figure 29:
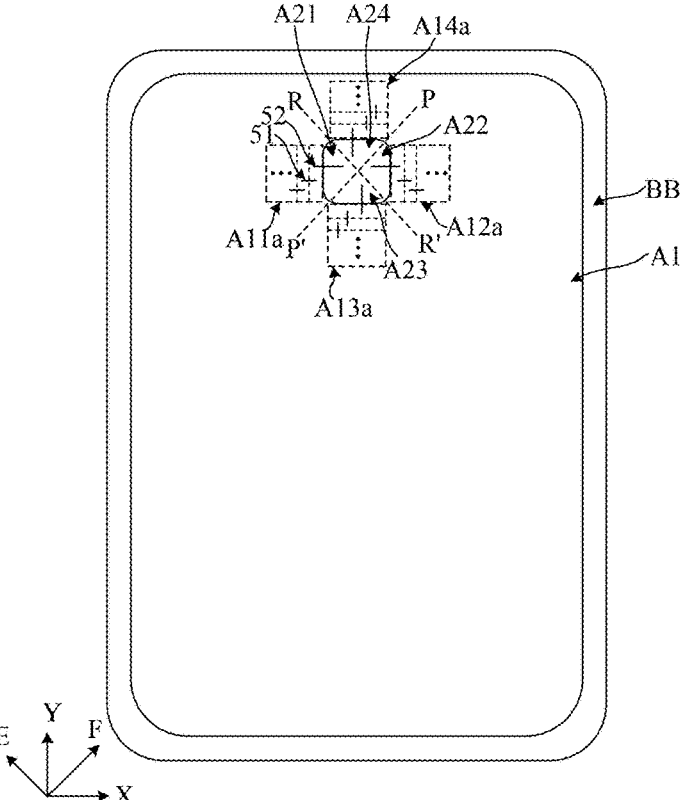
FIG. 29 is a schematic diagram of another connection between a first display region and a second display region according to at least one embodiment of the present disclosure.

FIG. 29 is a schematic diagram of another connection between a first display region and a second display region according to at least one embodiment of the present disclosure. In some examples, a region, in which a second pixel circuit is disposed, may be obtained by reducing sizes of a first pixel circuit in a row direction X and a column direction Y. However, this embodiment is not limited thereto.

In this example, as shown in FIG. 29, the second display region may be located at a top central position of a display region, and the first display region A1 surrounds the second display region. The second display region may include a first partition A21, a second partition A22, a third partition A23, and a fourth partition A24. The first partition A21, the second partition A22, the third partition A23, and the fourth partition A24 may be obtained by dividing the second display region A2 according to a central axis RR' in a fifth direction F and a central axis PP' in a sixth direction E. In some examples, the fifth direction F and the sixth direction E both intersect with the row direction X and the column direction Y. For example, the fifth direction F may intersect vertically with the sixth direction E, the fifth direction F may be located between the row direction X and the column direction Y, and an included angle between the fifth direction F and the row direction X along a clockwise direction may be about 45 degrees. However, this embodiment is not limited thereto. For example, the included angle between the fifth direction F and the row direction X along the clockwise direction may be about 30 degrees to 60 degrees.

In some examples, as shown in FIG. 29, the first partition A21 may include a plurality of second sub-display regions divided along a first direction (parallel to the row direction X in this example), or the first partition A21 may be used as one second sub-display region as a whole. The second partition A22 may include a plurality of fourth sub-display regions divided along a second direction (parallel to the row direction X in this example), or the second partition A22 may be used as one fourth sub-display region as a whole. The third partition A23 may include a plurality of sixth sub-display regions divided along a third direction (parallel to the column direction Y in this example), or the third partition A23 may be used as one sixth sub-display region as a whole. The fourth partition A24 may include a plurality of eighth sub-display regions divided along a fourth direction (parallel to the column direction Y in this example), or the fourth partition A24 may be used as one eighth sub-display region as a whole.

In some examples, as shown in FIG. 29, the first display region A1 may include a plurality of first sub-display regions A11a disposed sequentially along a side away from the first partition A21 in the first direction, a plurality of third sub-display regions A12a disposed sequentially along a side away from the second partition A22 in the second direction, a plurality of fifth sub-display regions A13a disposed sequentially along a side away from the third partition A23 in the third direction, and a plurality of seventh sub-display regions A14a disposed sequentially along a side away from the fourth partition A24 in the fourth direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51. A second light emitting element within a sixth sub-display region may be electrically connected with a second pixel circuit within one fifth sub-display region A13a closest to the third partition A23 through a second conductive line 52, and a first light emitting element within this fifth sub-display region A13a may be electrically connected with a first pixel circuit within another fifth sub-display region A13a along a side away from the third partition A23 through a first conductive line 51. A second light emitting element within an eighth sub-display region may be electrically connected with a second pixel circuit within one seventh sub-display region A14a closest to the fourth partition A24 through a second conductive line 52, and a first light emitting element within this seventh sub-display region A14a may be electrically connected with a first pixel circuit within another seventh sub-display region A14a along a side away from the fourth partition A24 through a first conductive line 51.

A connection relationship between a first sub-display region and a second sub-display region, a connection relationship between a third sub-display region and a fourth sub-display region, a connection relationship between a fifth sub-display region and a sixth sub-display region, a connection relationship between a seventh sub-display region and an eighth sub-display region, and a connection mode between a pixel circuit and a light emitting element according to this embodiment may be referred to description of the aforementioned embodiments, and thus will not be repeated here.

Figures 30, 31:
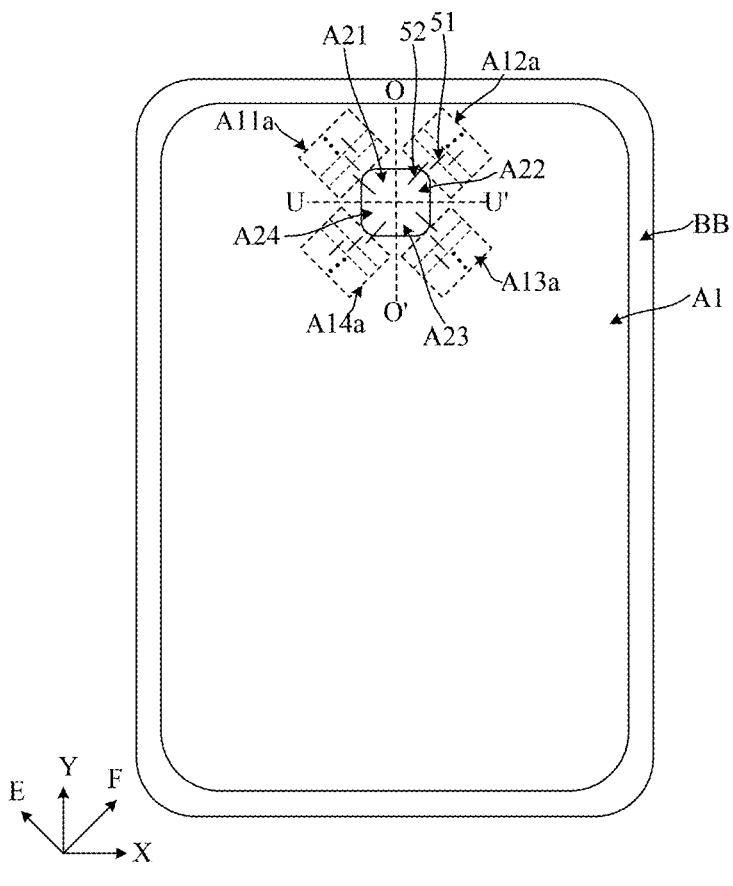
FIG. 30 is a schematic diagram of another connection between a first display region and a second display region according to at least one embodiment of the present disclosure.
FIG. 31 is a schematic diagram of a display apparatus according to at least one embodiment of the present disclosure.

FIG. 30 is a schematic diagram of another connection between a first display region and a second display region according to at least one embodiment of the present disclosure. In this example, a region, in which a second pixel circuit is disposed, may be obtained by reducing sizes of a first pixel circuit in a row direction X and a column direction Y. In this example, as shown in FIG. 30, the second display region may be located at a top central position of a display region, and the first display region A1 surrounds the second display region. The second display region may include a first partition A21, a second partition A22, a third partition A23, and a fourth partition A24. The first partition A21 to the fourth partition A24 may be obtained by being divided according to a central axis OO' in the row direction X and a central axis UU' in the column direction Y of the second display region.

In some examples, as shown in FIG. 30, the first partition A21 may include a plurality of second sub-display regions divided along a first direction (parallel to a sixth direction E in this example), or the first partition A21 may be used as one second sub-display region as a whole. The second partition A22 may include a plurality of fourth sub-display regions divided along a second direction (parallel to a fifth direction F in this example), or the second partition A22 may be used as one fourth sub-display region as a whole. The third partition A23 may include a plurality of sixth sub-display regions divided along a third direction (parallel to the sixth direction E in this example), or the third partition A23 may be used as one sixth sub-display region as a whole. The fourth partition A24 may include a plurality of eighth sub-display regions divided along a fourth direction (parallel to the fifth direction F in this example), or the fourth partition A24 may be used as one eighth sub-display region as a whole.

In some examples, as shown in FIG. 30, the first display region A1 may include a plurality of first sub-display regions A11a disposed sequentially along a side away from the first partition A21 in the first direction, a plurality of third sub-display regions A12a disposed sequentially along a side away from the second partition A22 in the second direction, a plurality of fifth sub-display regions A13a disposed sequentially along a side away from the third partition A23 in the third direction, and a plurality of seventh sub-display regions A14a disposed sequentially along a side away from the fourth partition A24 in the fourth direction. A second light emitting element within a second sub-display region may be electrically connected with a second pixel circuit within one first sub-display region A11a closest to the first partition A21 through a second conductive line 52, and a first light emitting element within this first sub-display region A11a may be electrically connected with a first pixel circuit within another first sub-display region A11a along a side away from the first partition A21 through a first conductive line 51. A second light emitting element within a fourth sub-display region may be electrically connected with a second pixel circuit within one third sub-display region A12a closest to the second partition A22 through a second conductive line 52, and a first light emitting element within this third sub-display region A12a may be electrically connected with a first pixel circuit within another third sub-display region A12a along a side away from the second partition A22 through a first conductive line 51. A second light emitting element within a sixth sub-display region may be electrically connected with a second pixel circuit within one fifth sub-display region A13a closest to the third partition A23 through a second conductive line 52, and a first light emitting element within this fifth sub-display region A13a may be electrically connected with a first pixel circuit within another fifth sub-display region A13a along a side away from the third partition A23 through a first conductive line 51. A second light emitting element within an eighth sub-display region may be electrically connected with a second pixel circuit within one seventh sub-display region A14a closest to the fourth partition A24 through a second conductive line 52, and a first light emitting element within this seventh sub-display region A14a may be electrically connected with a first pixel circuit within another seventh sub-display region A14a along a side away from the fourth partition A24 through a first conductive line 51.

A connection relationship between a first sub-display region and a second sub-display region, a connection relationship between a third sub-display region and a fourth sub-display region, a connection relationship between a fifth sub-display region and a sixth sub-display region, a connection relationship between a seventh sub-display region and an eighth sub-display region, and a connection mode between a pixel circuit and a light emitting element according to this embodiment may be referred to description of the aforementioned embodiments, and thus will not be repeated here.

At least one embodiment of the present disclosure also provides a display apparatus which includes the display substrate as described above.

FIG. 31 is a schematic diagram of a display apparatus according to at least one embodiment of the present disclosure. As shown in FIG. 31, this embodiment provides a display apparatus, which includes a display substrate 91 and a photosensitive sensor 92 located on a light exit side of a display structure layer away from the display substrate 91. An orthographic projection of the photosensitive sensor 92 on the display substrate 91 is overlapped with a second display region A2.

In some exemplary implementation modes, the display substrate 91 may be a flexible OLED display substrate, a QLED display substrate, a Micro-LED display substrate, or a Mini-LED display substrate. The display apparatus may be any product or component with a display function such as an OLED display, a cell phone, a tablet, a television, a display, a laptop, a digital photo frame, and a navigator, which is not limited in the embodiments of the present disclosure.

The drawings of the present disclosure only involve structures involved in the present disclosure, and other structures may refer to conventional designs. The embodiments of the present disclosure, i.e., features in the embodiments, may be combined with each other to obtain new embodiments if there is no conflict.

Those of ordinary skills in the art should understand that modification or equivalent replacement may be made to the technical solutions of the present disclosure without departing from the spirit and scope of the technical solutions of the present disclosure, and shall all fall within the scope of the claims of the present disclosure.

The invention claimed is:

1. A display substrate, comprising:
   a base substrate, comprising a first display region and a second display region, wherein the first display region is located on at least one side of the second display region;
   a plurality of pixel circuits, comprising a plurality of first pixel circuits and a plurality of second pixel circuits located in the first display region; and a plurality of light emitting elements, comprising a plurality of first light emitting elements located in the first display region and a plurality of second light emitting elements located in the second display region;

wherein at least one first pixel circuit in the plurality of first pixel circuits is electrically connected with at least one first light emitting element in the plurality of first light emitting elements, the at least one first pixel circuit is configured to drive the at least one first light emitting element to emit light, at least one second pixel circuit in the plurality of second pixel circuits is electrically connected with at least one second light emitting element in the plurality of second light emitting elements, and the at least one second pixel circuit is configured to drive the at least one second light emitting element to emit light;

the first display region comprises a first first sub-display region to an N-th first sub-display region which are arranged sequentially along a side away from the second display region in a first direction, wherein N is an integer greater than 1; and the second display region comprises at least one second sub-display region, a second light emitting element of the second sub-display region is electrically connected with a second pixel circuit of an n-th first sub-display region, and a first light emitting element of the n-th first sub-display region is electrically connected with a first pixel circuit of an (n+i)-th first sub-display region, wherein both n and i are integers greater than 0 and less than N, wherein a second light emitting element within the second sub-display region close to the n-th first display region is electrically connected with a second pixel circuit within the n-th first sub-display region close to the second sub-display region, and a second light emitting element within the second sub-display region away from the n-th first sub-display region is electrically connected with a second pixel circuit within the n-th first sub-display region away from the second sub-display region.

2. The display substrate according to claim 1, wherein a first light emitting element of the (n+i)-th first sub-display region is electrically connected with a first pixel circuits of an (n+i+j)-th first sub-display region, wherein j is an integer greater than 0 and less than N.

3. The display substrate according to claim 2, wherein j is equal to i.

4. The display substrate according to claim 2, wherein the at least one first pixel circuit is electrically connected with the at least one first light emitting element through a first conductive line, and the at least one second pixel circuit is electrically connected with the at least one second light emitting element through a second conductive line.

5. The display substrate according to claim 4, wherein a first conductive line or a second conductive line which is electrically connected with at least one pixel circuit within the at least one first sub-display region is of a different-layer structure with a first conductive line which is electrically connected with at least one first light emitting element.

6. The display substrate according to claim 5, wherein a second conductive line electrically connecting the second pixel circuit of the n-th first sub-display region and the second light emitting element of the second sub-display region is of a different-layer structure with a first conductive line electrically connecting the first light emitting element of the n-th first sub-display region and the first pixel circuit of the (n+i)-th first sub-display region.

7. The display substrate according to claim 5, wherein a first conductive line electrically connecting the first light emitting element of the (n+i)-th first sub-display region and the first pixel circuit of the (n+i+j)-th first sub-display region is of a different-layer structure with a first conductive line electrically connecting the first pixel circuit of the (n+i)-th first sub-display region and the first light emitting element of the n-th first sub-display region.

8. The display substrate according to claim 4, wherein second conductive lines electrically connected with second light emitting elements within adjacent second sub-display regions are located in different conductive layers, and first conductive lines electrically connected with first light emitting elements within adjacent first sub-display regions are located in different conductive layers.

9. The display substrate according to claim 4, wherein second conductive lines electrically connected with the plurality of second light emitting elements within the second sub-display region are of a same-layer structure.

10. The display substrate according to claim 4, wherein second conductive lines electrically connected with adjacent second light emitting elements in the first direction within the second sub-display region are of a different-layer structure.

11. The display substrate according to claim 1, wherein a quantity of pixel circuits within the at least one first sub-display region is greater than a quantity of first light emitting elements.

12. The display substrate according to claim 1, wherein pixel circuits within the n-th first sub-display region are all second pixel circuits.

13. The display substrate according to claim 1, wherein a quantity of pixel circuits of the n-th first sub-display region is greater than or equal to a quantity of pixel circuits of an (n+1)-th first sub-display region, and a quantity of first light emitting elements of the n-th first sub-display region is greater than or equal to a quantity of first light emitting elements of the (n+1)-th first sub-display region.

14. The display substrate according to claim 1, wherein pixel circuits of the first display region are arranged in an array, and the first direction is a row direction of the pixel circuits.

15. The display substrate according to claim 1, wherein the second display region comprises an M-th second sub-display region to a first second sub-display region which are arranged sequentially along a side away from the first sub-display region in the first direction, wherein M is an integer greater than 1 and less than N; and wherein a first sub-display region, in which a second pixel circuit electrically connected with a second light emitting element within an m-th second sub-display region is located, is located on a side of a first sub-display region, in which a second pixel circuit electrically connected with a second light emitting element within an (m+1)-th second sub-display region is located, close to the second display region, wherein m is an integer greater than 0 and less than M.

16. The display substrate according to claim 1, wherein the first display region further comprises a first third sub-display region to an H-th third sub-display region arranged sequentially along a side away from the second display region in a second direction, wherein H is an integer greater than 1; and the second display region further comprises at least one fourth sub-display region, a second light emitting element of the fourth sub-display region is electrically connected with a second pixel circuit of an h-th third sub-display region, and a first light emitting element of the h-th third sub-display region is electrically connected with a first pixel circuit of an (h+s)-th third sub-display region, wherein both h and s are integers greater than 0 and less than H.

17. The display substrate according to claim 16, wherein the first display region further comprises a first fifth sub-display region to an R-th fifth sub-display region arranged sequentially along a side away from the second display region in a third direction, wherein R is an integer greater than 1; and the second display region further comprises at least one sixth sub-display region, a second light emitting element of the sixth sub-display region is electrically connected with a second pixel circuit of an r-th fifth sub-display region, and a first light emitting element of the r-th fifth sub-display region is electrically connected with a first pixel circuit of an (r+k)-th fifth sub-display region, wherein both r and k are integers greater than 0 and less than R.

18. The display substrate according to claim 17, wherein the first display region further comprises a first seventh sub-display region to a G-th seventh sub-display region which are sequentially arranged along a side away from the second display region in a fourth direction, wherein G is an integer greater than 1; and the second display region further comprises at least one eighth sub-display region, a second light emitting element of the eighth sub-display region is electrically connected with a second pixel circuit of a g-th seventh sub-display region, and a first light emitting element of the g-th seventh sub-display region is electrically connected with a first pixel circuit of a (g+d)-th seventh sub-display region, wherein both g and d are integers greater than 0 and less than G.

19. A display apparatus, comprising the display substrate according to claim 1.

* * * * *